(12) United States Patent
Matsuyama et al.

(10) Patent No.: US 6,602,382 B1
(45) Date of Patent: Aug. 5, 2003

(54) SOLUTION PROCESSING APPARATUS

(75) Inventors: Yuji Matsuyama, Kikuchi-gun (JP); Shuichi Nagamine, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/694,888

(22) Filed: Oct. 25, 2000

(30) Foreign Application Priority Data

Oct. 26, 1999 (JP) .............................. 11-304363
Oct. 27, 1999 (JP) .............................. 11-305523

(51) Int. Cl.$^7$ ........................ C23F 1/00; H01L 21/306
(52) U.S. Cl. ................... 156/345.11; 156/345.15; 118/323; 118/DIG. 4
(58) Field of Search .................. 156/345; 118/300–326, 118/715, DIG. 4

(56) References Cited

U.S. PATENT DOCUMENTS

| 4,550,681 A | * | 11/1985 | Zimmer et al. ............. 118/410 |
| 4,564,280 A | * | 1/1986 | Fukada ........................ 354/317 |
| 4,900,593 A | * | 2/1990 | Krippl ........................ 427/410 |
| 4,922,851 A | * | 5/1990 | Morikawa et al. ............ 118/324 |
| 5,020,200 A | * | 6/1991 | Mimasaka et al. .......... 29/25.01 |
| 5,252,137 A | | 10/1993 | Tateyama et al. |
| 5,612,725 A | * | 3/1997 | Okimoto ...................... 347/71 |
| 5,654,040 A | * | 8/1997 | Matsunaga .................. 427/420 |
| 5,769,946 A | * | 6/1998 | Kutsuzawa et al. ......... 118/407 |
| 5,788,773 A | * | 8/1998 | Okuda et al. ............... 118/319 |
| 5,854,953 A | | 12/1998 | Semba |
| 5,885,661 A | * | 3/1999 | Batchelder .................. 427/425 |
| 5,942,037 A | * | 8/1999 | Wagener et al. ............ 118/315 |
| 5,954,877 A | * | 9/1999 | Hayes ......................... 118/319 |
| 6,120,834 A | * | 9/2000 | Terauchi ...................... 427/96 |
| 6,139,639 A | * | 10/2000 | Kitamura et al. ........... 118/680 |
| 6,248,175 B1 | * | 6/2001 | Subramanian et al. ...... 118/712 |
| 6,824,043 | * | 9/2001 | Takekuma .................... 118/52 |
| 6,364,547 B1 | * | 4/2002 | Matsuyama ................. 396/611 |
| 6,387,455 B1 | * | 5/2002 | Katagiri et al. ............. 427/420 |
| 6,423,144 B1 | * | 7/2002 | Watanabe ................... 118/669 |
| 6,514,570 B1 | * | 2/2003 | Matsuyama et al. ........ 427/421 |

FOREIGN PATENT DOCUMENTS

JP          11-74195        3/1999

\* cited by examiner

*Primary Examiner*—Benjamin L. Utech
*Assistant Examiner*—Karla Moore
(74) *Attorney, Agent, or Firm*—Rader, Fishman & Grauer PLLC

(57) ABSTRACT

A developing processing apparatus for supplying a developing solution to a wafer on which a photoresist film has been formed to thereby perform developing processing includes a wafer holding portion for horizontally holding the wafer, a linear nozzle held above the wafer holding portion for supplying the developing solution onto the wafer while moving in a predetermined horizontal direction, and a resistance bar for imparting discharge resistance to the developing solution discharged from the linear nozzle. This allows all discharge ports to discharge the developing solution uniformly, especially even when discharge pressure for the developing solution to be supplied is low in development of a scan method using a linear nozzle or a slit nozzle.

9 Claims, 21 Drawing Sheets

SOLUTION PROCESSING APPARATUS

CROSS-REFERENCE TO RELATED APPLICATIONS

This application is based upon and claims the benefit of priority from the prior Japanese Patent Applications No. 11-304363, filed Oct. 26, 1999; and No. 11-305523, filed Oct. 27, 1999, the entire contents of which are incorporated herein by reference.

BACKGROUND OF THE INVENTION

The present invention relates to a solution processing apparatus for supplying a developing solution to the surface of a substrate, for example, a semiconductor wafer or the like which has been coated with a resist and subjected to exposure processing to thereby perform developing processing.

In semiconductor device fabrication, a photoresist is applied to a semiconductor wafer as a substrate to be processed, a mask pattern is transferred to the photoresist by exposure processing, and the photoresist is subjected to developing processing to thereby form a circuit pattern.

In a developing processing step here, the so-called puddle method, in which a developing solution is particularly continuously supplied from a nozzle to the semiconductor wafer and heaped on a face on which a pattern will be formed only for a predetermined period of time for a contact therebetween to thereby develop a latent pattern in the applied resist film, is generally employed.

A puddle method using the so-called linear nozzle in which many solution discharge ports are arranged in a straight line at predetermined intervals is the current mainstream. Developing methods using the above linear nozzles are roughly divided into (1) "a rotation method" of performing solution heaping on the wafer by rotating the wafer 180° while the developing solution is being discharged from the linear nozzle, and (2) "a scan method" of performing solution heaping by horizontally moving the linear nozzle in one direction with respect to the wafer without rotating the wafer.

The former rotation method is invented from a recent demand for saving of consumption of a developing solution and that solution heaping is performed in a short time and uniformly. However, by the rotation method, there may be cases where chips in the vicinity of the central portion of the wafer that is the rotational center become defective pieces depending on the type of resist.

More specifically, the solution heaping of the developing solution is performed over the entire wafer by rotating the wafer 180° with the nozzle being fixed in the rotation method. By such a method, a fresh developing solution is supplied only to a part close to the central portion of the wafer, and thus it is conceivable that development excessively proceeds only at this part compared with a peripheral part. With micro-machining and higher density in recent circuit pattern, resists have been improved in performance, that is, increased in resolution. Accordingly, problems that have been neglected before are coming up, and, for example, in the case in which a chemically amplified resist (CAR) is used, there is a problem that the aforesaid phenomenon obviously occurs, whereby a desired resolution can not be obtained.

On the other hand, by the scan method, though it takes a slightly long time for solution heaping compared with the aforesaid rotation method, the above problem does not occur, and thus this method is recognized as a promising method in recent years.

In the scan developing method, the aforesaid linear nozzle is used to discharge the developing solution from many discharge ports at the same time with the discharge ports being brought close to the surface of the wafer. Then, the linear nozzle is horizontally moved (scan-moved) in parallel to the surface of the wafer to thereby form a developing solution film on the wafer.

The linear nozzle here is configured such that after the developing solution is stored in a solution storage portion provided therein, pressure is applied to the solution storage portion to thereby discharge the developing solution via the aforesaid many discharge ports. In this case, solutions supplied from the discharge ports in the form of vertically split screen spread out to some extent above the surface of the wafer, and adjacent solutions unite with each other to be supplied onto the wafer in curtain form or film form. Then, the linear nozzle is moved in accordance with the discharge speed of the developing solution, whereby the solution flow in film form can be mounted on the wafer.

The important thing in the developing method as described above is that the developing solution is uniformly discharged from all the discharge ports to form a solution flow in film form with a uniform thickness. Just after the discharge, however, the thickness is prone to become nonuniform. Further, depending especially on the type of resist to be applied to the wafer, it is necessary to reduce the discharge amount and the discharge speed of the developing solution so as to decrease the influence of impact and the like exerted on the resist. In this case, it becomes further difficult to form a solution flow in film form with a uniform thickness.

On the other hand, there is a linear nozzle provided with a discharge port in slit form having a length corresponding to a diameter of the wafer. This nozzle is generally called a slit nozzle, in which unevenness in discharge pressure is prone to occur, and therefore it is further difficult to form a solution flow in film form with a uniform thickness.

Moreover, in the above-described method, the supply nozzle is moved with a tip of the supply nozzle contacting the developing solution supplied on the wafer, and thus if a supply nozzle made of a hydrophobic material is used, the developing solution is rejected by the surface of the nozzle and it becomes difficult to supply the developing solution to the surface of the wafer in a uniform state, bringing about a problem that development unevenness is likely to occur.

In the case in which a supply nozzle made of a hydrophilic material is used, the developing solution is brought into a state of being pushed out when the supply nozzle is moved at a low scan speed, for example, at about 50 mm/sec, with the result that the developing solution flows to a position ahead of the nozzle in respect to a direction of movement of the nozzle. If the developing solution flows ahead of the supply nozzle as described above, development proceeds at this part, and thereafter the supply nozzle moves to this part and the developing solution is supplied thereto, which is the same as a state in which development is performed twice for this part, development proceeding too much compared with other parts, resulting in nonuniform line width.

If a phenomenon of the developing solution flowing ahead occurs over the entire wafer W and every part is brought to a state of being subjected to development twice here, occurrence of development unevenness can be prevented. However, the developing solution actually flows ahead at some parts and not at other parts, resulting in occurrence of development unevenness and nonuniform line width.

BRIEF SUMMARY OF THE INVENTION

An object of the present invention is to provide a solution processing apparatus capable of discharging a developing solution uniformly from all discharge ports even when, for example, discharge pressure for the developing solution to be supplied is low in development of a scan method using a linear nozzle or a slit nozzle.

Another object of the present invention is to provide a solution processing apparatus capable of performing uniform solution processing on the surface of a substrate.

To attain the above objects, with a primary aspect of the present invention, provided is a developing processing apparatus for supplying a developing solution to a substrate to be processed on which a photoresist film has been formed to thereby perform developing processing, including: a substrate holding mechanism for horizontally holding the substrate to be processed; a developing solution supply nozzle held above the substrate holding mechanism for supplying the developing solution onto the substrate to be processed while moving in a predetermined horizontal direction; and discharge resistance imparting means, disposed behind the substrate in a direction of movement of the developing solution supply nozzle, for imparting discharge resistance to the developing solution discharged from the nozzle.

With the above configuration, the discharge resistance is imparted to the developing solution discharged from the developing solution supply nozzle, thereby making it possible to adjust the discharge state of the developing solution uniform over the entire width of the nozzle. Further, the discharge resistance is imparted to the developing solution, whereby the developing solution just after discharged spreads out, facilitating the formation of a developing solution flow in film form.

According to one embodiment, the discharge resistance imparting means is provided at a developing solution discharge start position of the developing solution supply nozzle. This configuration makes it possible to increase the discharge pressure just after the start of discharge to thereby make the discharge state uniform.

Further, according to another embodiment, the developing solution supply nozzle has a developing solution discharge port provided over a region corresponding to a width of the substrate to be processed. In this case, the developing solution discharge port of the developing solution supply nozzle may be composed of a plurality of discharge ports provided side by side over the region corresponding to the width of the substrate to be processed or a discharge port in slit form provided over the region corresponding to the width of the substrate to be processed.

According to one embodiment, the discharge resistance imparting means is a plate member or a rod member provided close to an under face of the developing solution supply nozzle and having a width slightly greater than a width of the discharge ports (port)of the developing solution supply nozzle.

According to still another embodiment, the discharge resistance imparting means is a plate member provided close to an under face of the developing solution supply nozzle and having a drain passage capable of draining the developing solution.

Further, according to another embodiment, the discharge resistance imparting means is gas-flow blasting means provided to face an under face of the developing solution supply nozzle for blasting gas-flow to the discharged developing solution.

A solution processing apparatus according to the present invention is characterized by including a substrate holding portion for nearly horizontally holding a substrate; and a supply nozzle with discharge ports formed over a length nearly equal to or greater than a width of an effective area of the substrate, provided to be movable relative to the substrate, for supplying a processing solution to the surface of the substrate held by the substrate holding portion, the supply nozzle being configured to move relative to the substrate with allowing a tip of a member forming the discharge ports to contact the processing solution supplied on the surface of the substrate to supply the processing solution to the surface of the substrate, and the member forming the discharge ports being hydrophobic at a forward part in respect to a direction of movement of the supply nozzle and contacting the processing solution on the surface of the substrate.

In this configuration, even if the processing solution on the surface of the substrate is likely to flow to a position ahead of the supply nozzle in respect to the direction of :movement during the supply of the processing solution from the supply nozzle to the surface of the substrate, upon touching the forward part of the member forming the discharge ports, the processing solution is rejected by the hydrophobic surface of the member, so that occurrence of the phenomenon of developing solution flowing ahead can be prevented.

Further, in the present invention, the member forming the discharge ports of the supply nozzle may be hydrophilic at a part behind the hydrophobic part in respect to the direction of movement of the supply nozzle and contacting the processing solution on the surface of the substrate, and in this case, an adhesion strength of the processing solution to the part is large, thus further preventing the processing solution from flowing ahead.

"Hydrophobic" means here that surface tension of the hydrophobic part is smaller than the original surface tension of the material of the member forming the discharge ports of the supply nozzle, and "hydrophilic" means that surface tension of the hydrophilic part is larger than the original surface tension of the material of the member forming the discharge ports of the supply nozzle.

Furthermore, the present invention is characterized by including a substrate holding portion for nearly horizontally holding a substrate; and a supply nozzle with discharge ports formed over a length nearly equal to or greater than a width of an effective area of the substrate, provided to be movable relative to the substrate, for supplying a solution to the surface of the substrate held by the substrate holding portion, the supply nozzle being provided with a guide for guiding the processing solution discharged from the discharge ports to the surface of the substrate, on the front side in respect to a direction of movement of the supply nozzle in a manner to adjoin to a member forming the discharge ports. Moreover, a tip of the guide may be curved to locate behind the discharge ports in respect to the direction of movement of the supply nozzle.

In this configuration, even if the processing solution on the surface of the substrate is likely to flow to a position ahead of the supply nozzle in respect to the direction of movement during the supply of the processing solution to the surface of the substrate by the supply nozzle, the processing solution is prevented from flowing to the position ahead of the guide by the guide, so that occurrence of the phenomenon of developing solution flowing ahead can be prevented.

These objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, embodiments of the present invention will be explained with reference to the drawings.

Figure 1:
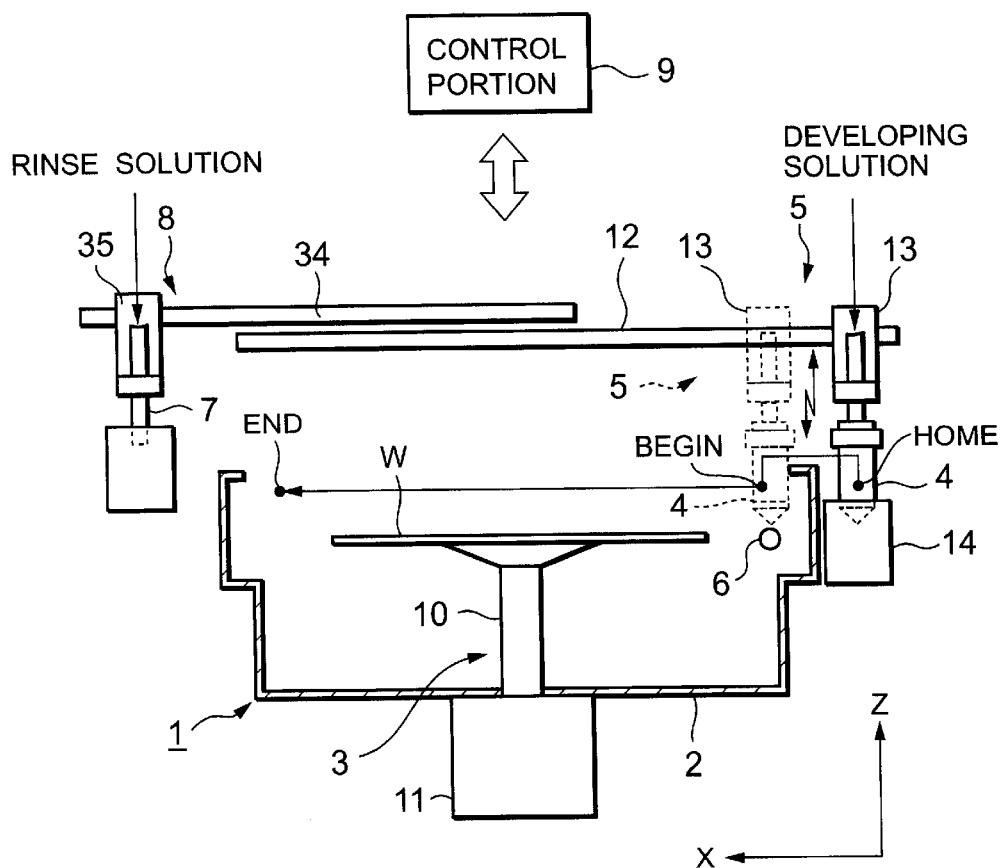
FIG. 1 is a diagrammatic view showing a developing processing apparatus according to an embodiment of the present invention.
Figure 2:
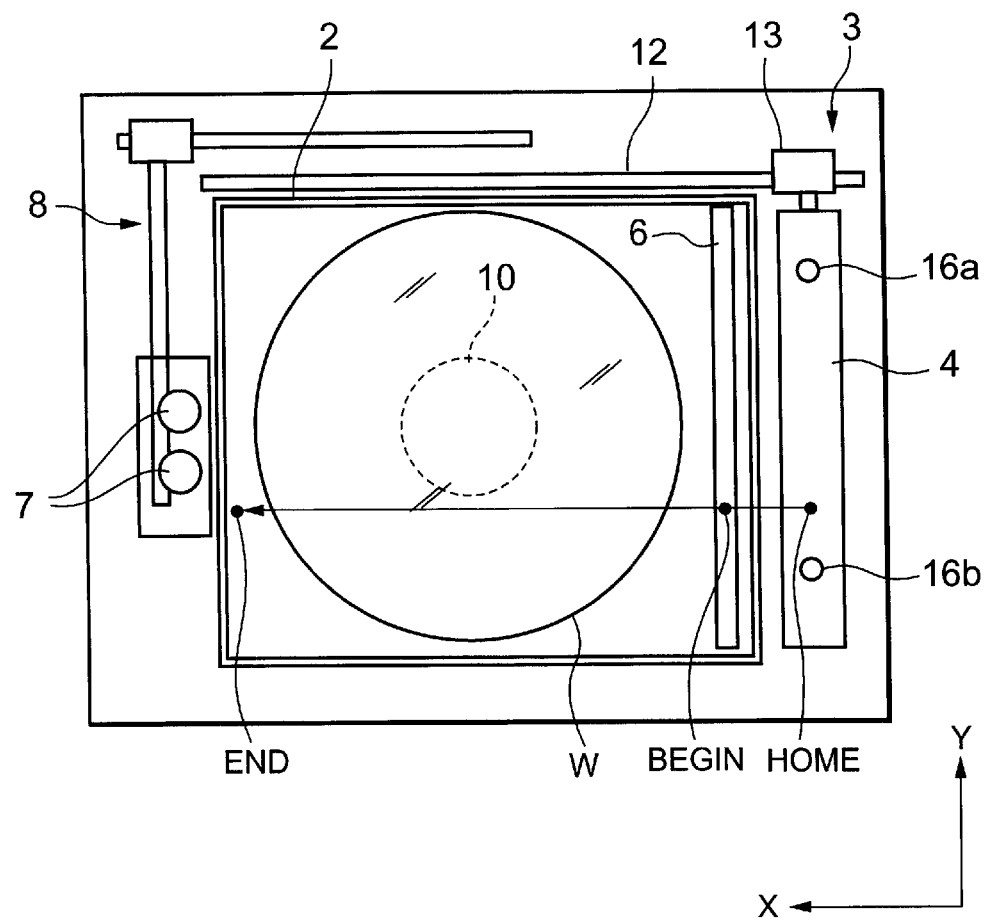
FIG. 2 is a plan view of the developing processing apparatus of the same.

FIG. 1 is a diagrammatic view showing a developing processing apparatus 1 according to an embodiment, and FIG. 2 is a plan view thereof.

As shown in FIG. 1, the developing processing apparatus 1 includes an outer cup 2, a wafer holding portion 3 provided in the outer cup 2 for holding a wafer W (a wafer which has been coated with a resist solution and subjected to exposure processing) as a substrate to be processed, a developing solution supply portion 5 for scan-driving a linear nozzle 4 to supply a developing solution as a processing solution onto the wafer W, a resistance bar 6 provided in the outer cup 2 for imparting resistance to a developing solution discharged from the linear nozzle 4, a rinse solution supply portion 8 including a rinse nozzle 7 for performing rinse processing for the wafer W after development, and a control portion 9 for controlling these mechanisms.

A top end opening of the outer cup 2 is formed in, for example, a rectangular shape as shown in FIG. 2. The wafer holding portion 3 includes a spin chuck 10 for suction-holding the wafer W and a spin chuck drive mechanism 11 for rotating and raising and lowering the spin chuck 10. The wafer holding portion 3 has a function of shaking a developing solution off by centrifugal force by rotating the wafer W at a high speed at the time when removing by rinsing the developing solution supplied by the developing solution supply portion 5. The developing solution shaken off from the rim of the wafer W is caught by the outer cup 2 to be drained to the outside from a drain line not shown provided at the lower end portion of the cup 2.

On the other hand, the developing solution supply portion 5 has a vertical drive mechanism 13 such as an air cylinder or the like for holding the linear nozzle 4 and an X-direction linear guide mechanism 12 for scan-driving the vertical drive mechanism 13, for example, along a rail provided in an X-direction. The developing solution supply portion 5 drives the linear nozzle 4 vertically from a waiting portion 14 (HOME) shown by the solid line in the drawing and moves it in the X-direction, thereby positioning the linear nozzle 4 at a BEGIN position in the outer cup 2. Then, the X-direction linear guide mechanism 12 is operated to scan-drive the linear nozzle 4 in the X-direction along the surface of the wafer W to a position shown by END in the drawing.

Figure 3:
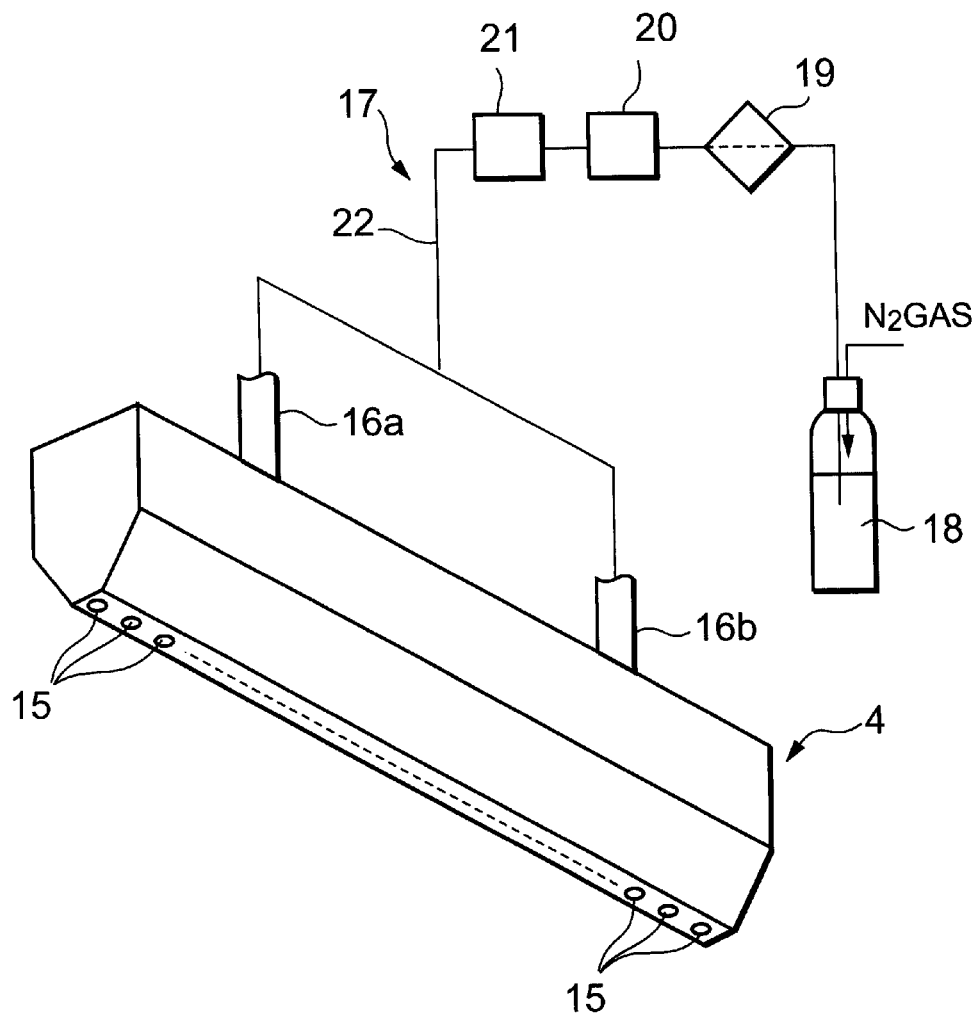
FIG. 3 is a perspective view of a linear nozzle and a block diagram showing a rinse solution supply system.

FIG. 3 is a schematic block diagram showing only the linear nozzle 4. The linear nozzle 4 has a main body with a width slightly longer than a diameter of the wafer W and is provided with a plurality of developing solution discharge ports 15 bored at the bottom face thereof at 2 mm pitches by way of example. A solution storage portion not shown is provided in the nozzle 4, and the developing solution supplied from supply pipes shown by numerals 16a and 16b in the drawing is temporarily stored in this solution storage portion and thereafter discharged from the discharge ports 15 at almost a uniform pressure.

The linear nozzle 4 here is connected to a supply system 17 shown in FIG. 3. In the supply system 17, an inert gas, for example, $N_2$ gas, is blasted into a developing solution tank 18 containing a developing solution, and the developing solution is sent through a filter 19, a solution amount controller 20, an open/close valve 21, and a supply pipe 22 to the linear nozzle 4 by the gas pressure.

The supply or stop of the developing solution is conducted by the open/close valve 21, which is controlled by the control portion 9. The solution amount controller 20 is also connected to the control portion 9.

Figure 4A:
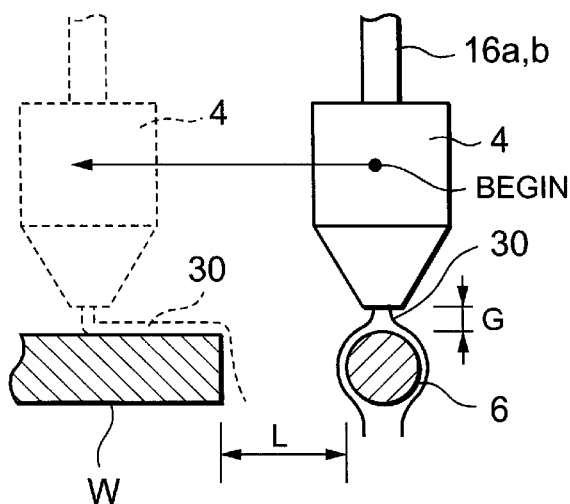
FIG. 4A and FIG. 4B are schematic views for explaining positional relation between the linear nozzle and a resistance bar (resistance imparting means) and functions thereof of the same.

On the other hand, in the outer cup 2 provided is the resistance bar 6 made of, for example, Teflon resin for imparting a predetermined discharge resistance to a flow of the developing solution discharged from the linear nozzle 4 as shown in FIG. 1. The resistance bar 6 is provided in correspondence with a scan start position of the linear nozzle 4, the BEGIN position. The resistance bar 6 is disposed to face an under face of the linear nozzle 4 with a predetermined clearance G interposed in-between as shown in FIG. 4A, thereby imparting discharge resistance to the developing solution discharged through each discharge port 15 of the linear nozzle 4. This temporarily raises the pressure in the solution storage portion in the linear nozzle 4 to apply a pressure higher than usual to the developing solution to be discharged from each discharge port 15.

Accordingly, the clearance G between the resistance bar 6 and the linear nozzle 4 is defined as a dimension capable of raising the pressure as described above. In this embodiment, the clearance G is set at 3 mm. The distance from the resistance bar 6 to the wafer W is determined with consideration of an acceleration distance required for a predetermined fixed speed at the point of time when the linear nozzle 4 which has been started from the BEGIN position reaches the wafer W. In this embodiment, the resistance bar 6 is disposed within 0 to 25 mm.

This can temporarily raise the pressure in the solution storage portion to discharge the developing solution from all the discharge ports 15 even when, for example, the developing solution is not discharged from some of many discharge ports 15 for some reason.

Meanwhile, as shown in FIG. 1, the rinse solution supply portion 8 has a vertical drive mechanism 35 for holding the rinse nozzle 7 and an X-direction linear guide mechanism 34 for driving the vertical drive mechanism 35 in the X-direction. The rinse nozzle 7 is disposed at a position on the opposite side to the waiting portion 14 of the linear nozzle 4 with the outer cup 2 interposed. The rinse nozzle 7 is connected to a rinse solution tank not shown so as to discharge the rinse solution by applying a pressure to the rinse solution in the rinse solution tank by an inert gas, for example, $N_2$ gas.

The rinse solution supply portion 8 is connected to the control portion 9 so that the rinse nozzle 7 is positioned to face the central portion of the wafer W to spray the rinse solution onto the wafer W by a command of the control portion 9.

Figure 5:
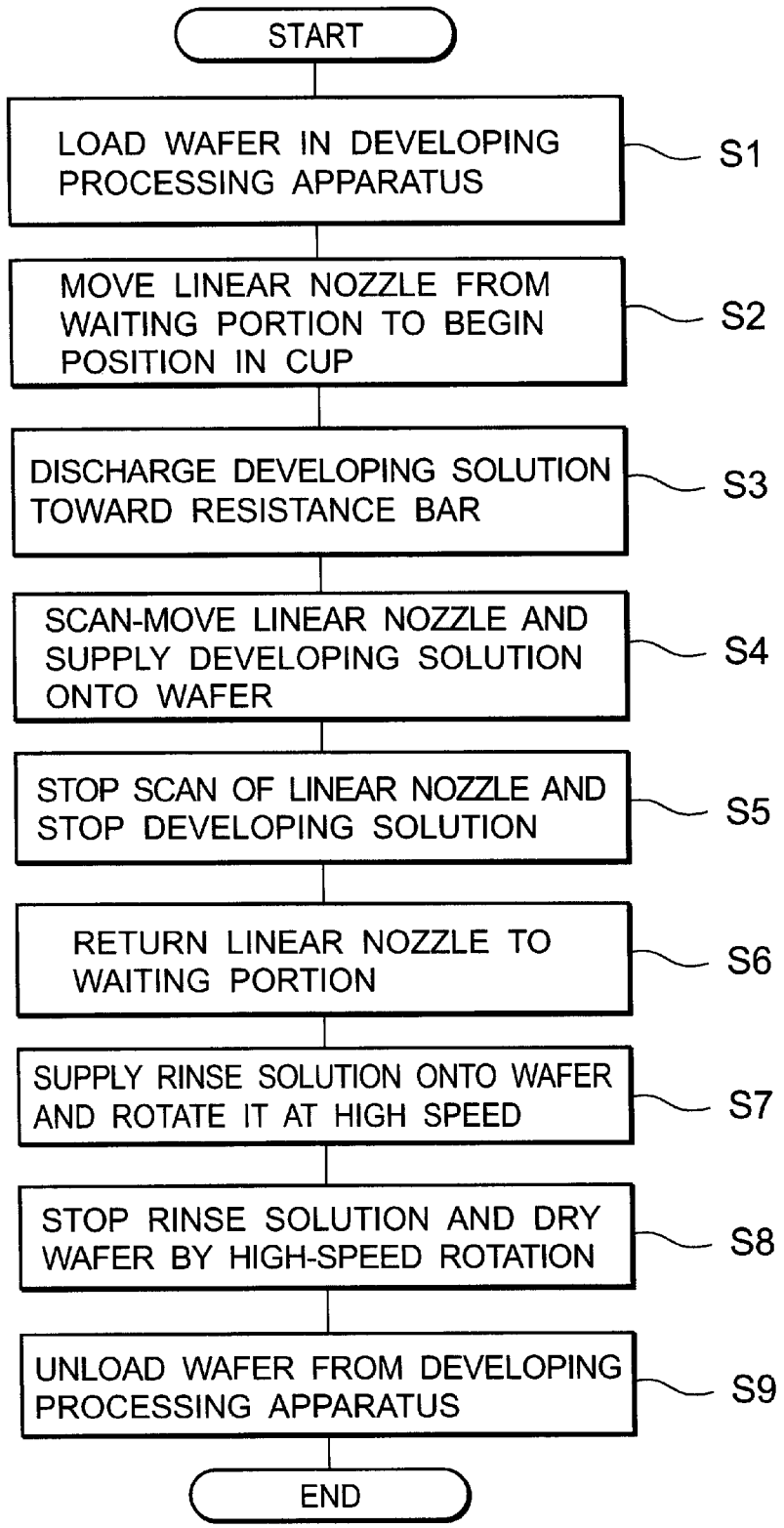
FIG. 5 is a flowchart for explaining operations of the same.

Next, operations of this apparatus will be explained with reference to a flowchart in FIG. 5.

First, the wafer W is loaded in the developing processing apparatus (step S1). More specifically, the spin chuck 10 is raised to a position above the outer cup 2, and the wafer W which has been coated with a resist solution and subjected to exposure processing in the prior steps is delivered from an arm not shown to the spin chuck 10 and held thereon. Thereafter, the spin chuck 10 is lowered, whereby the wafer W is housed in the outer cup 2.

Next, the linear nozzle 4 is Z-driven from the waiting portion 14 (HOME) and moved to a position above the outer cup 2. Subsequently, the linear nozzle 4 is lowered to be positioned at the BEGIN position in the cup 2 (step S2). This causes the under face of the linear nozzle 4 to face the resistance bar 6 with the clearance G of about 3 mm interposed.

Subsequently, the open/close valve 21 is opened to start the supply of the developing solution from each discharge port 15 of the linear nozzle 4 (step S3). This developing solution hits against the resistance bar 6 just after the discharge, with the result that resistance force acts on the discharge. This increases the pressure in the solution storage portion in the nozzle 4, causing the developing solution to be discharged uniformly from all of the discharge ports 15 as described above.

This causes all the discharge ports 15 to discharge the developing solution uniformly, even in the case of a low discharge pressure for the developing solution when the developing solution is supplied onto the wafer W, by temporarily increasing the discharge pressure at the time of the start of the discharge.

Figure 4B:
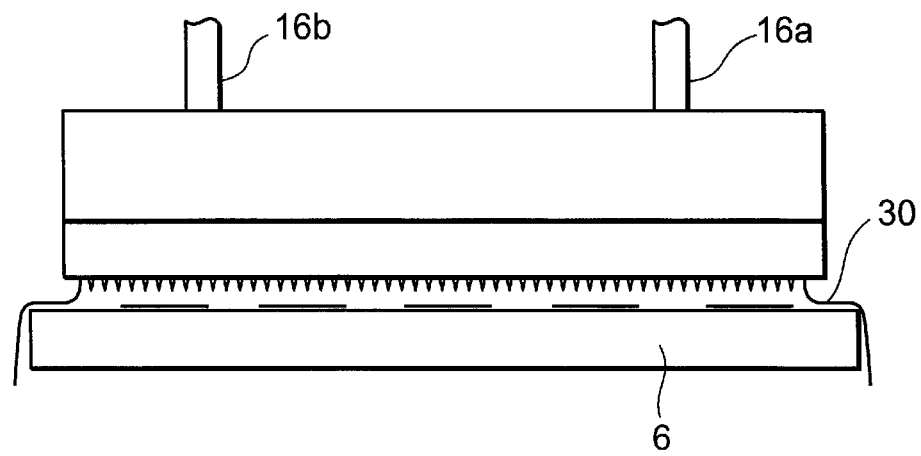

In addition, the developing solution discharged from the linear nozzle 4 hits against the resistance bar 6 as shown in FIG. 4B and spreads out, whereby solutions discharged from the discharge ports 15 in the form of vertically split screen contact each other to thereby form a solution flow in film form. It is conceivable that the developing solution can be discharged uniformly from all the discharge ports 15 by surface tension at this time.

Next, the X-direction linear guide mechanism 12 is operated to scan-drive the linear nozzle 4 in the X-direction (step S4). Even if the resistance bar 6 goes away from under the linear nozzle 4, the once formed solution flow in film form moves toward the wafer W while keeping the film form by its surface tension.

The linear nozzle 4 supplies the developing solution onto the wafer W while moving in the X-direction in the state shown by an arrow in FIG. 1 at a fixed speed, for example, at a scan speed of 5 cm/sec to 20 cm/sec. Thereby, a uniform developing solution film with a thickness of about 1 mm is continuously formed after the nozzle 4 passes.

Next, when the linear nozzle 4 scans over the other end side of the wafer W, the supply of the developing solution is stopped, and the scan in the X-direction by the X-direction: linear guide mechanism 12 is also stopped (step S5). An excessive developing solution dropped from the peripheral portion of the wafer W is caught by the cup 2 to be drained from a drain line not shown to the outside during the above-described developing solution supply step.

After the linear nozzle 4 has been returned to the waiting portion 14 and a predetermined developing period of time has elapsed, a rinse (removal of the developing solution) for the wafer W is performed (step S7). More specifically, the rinse solution supply portion 8 is operated to cause the rinse nozzle 7 to face the central portion of the wafer W and to supply pure water as a rinse solution to the central portion of the wafer W. Simultaneously with this, the spin chuck drive mechanism 11 is operated to rotate the wafer W at a high speed, whereby the developing solution on the wafer W is rinsed away with the rinse solution. Next, the supply of the pure wafer is stopped and the rotation is continued, whereby the wafer W is dried by being shaken (step S8).

After the completion of the dry of the wafer W, the wafer W is unloaded from the developing processing apparatus (step S9). More specifically, the wafer W is raised by the spin chuck 10 and taken out by the arm not shown to be ejected from the developing processing apparatus.

With the above-described configuration, the developing solution can be discharged in a uniform state from all the discharge ports even if the discharge pressure for the developing solution is low in the scan developing method.

It should be noted that this embodiment is naturally applicable to apparatuses other than the above-described developing processing apparatus. Moreover, various modifications may be made within the scope of the present invention.

Figure 6:
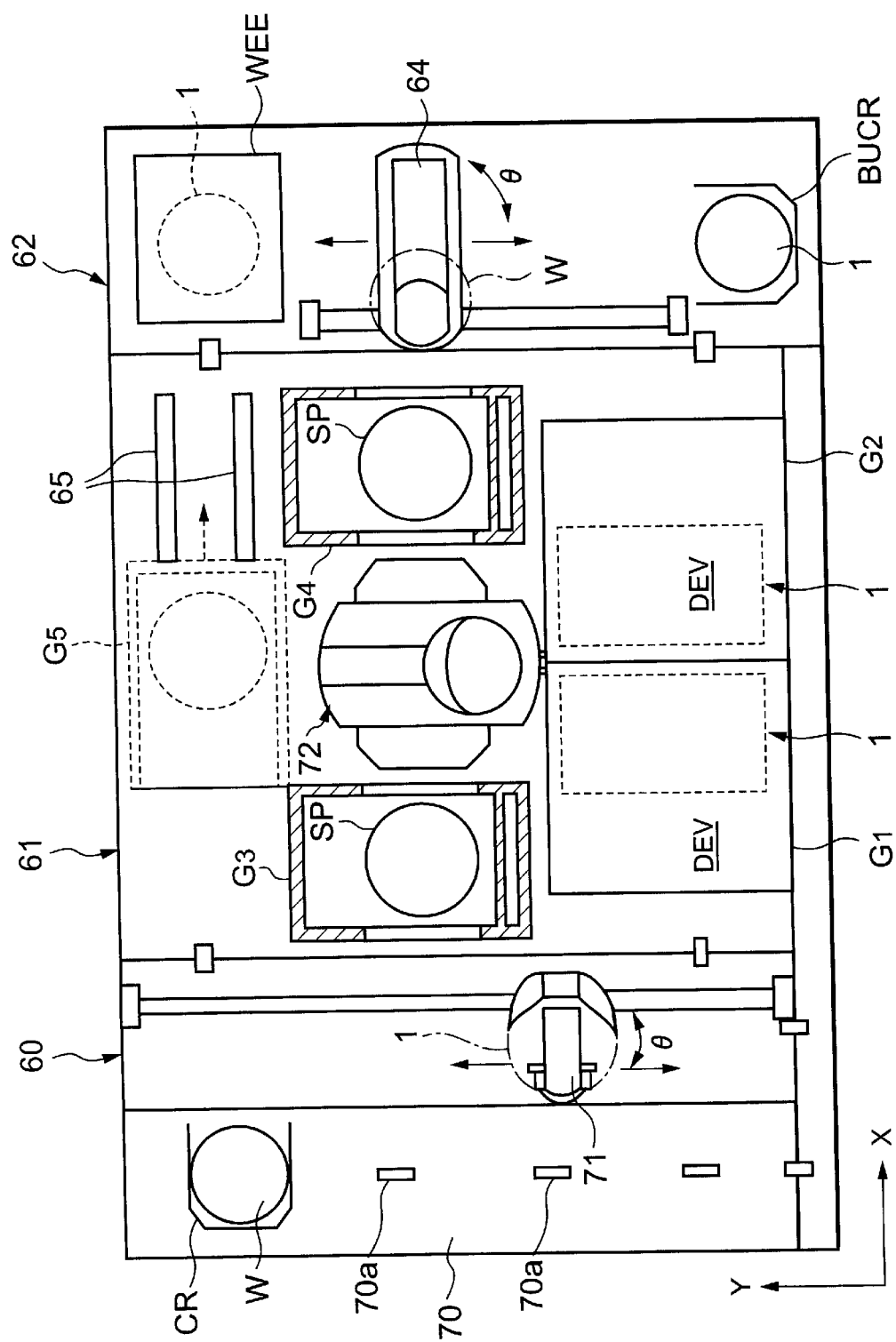
FIG. 6 is a plane layout view showing an entire structure of a coating and developing system to which an embodiment of the present invention is applied.
Figure 7:
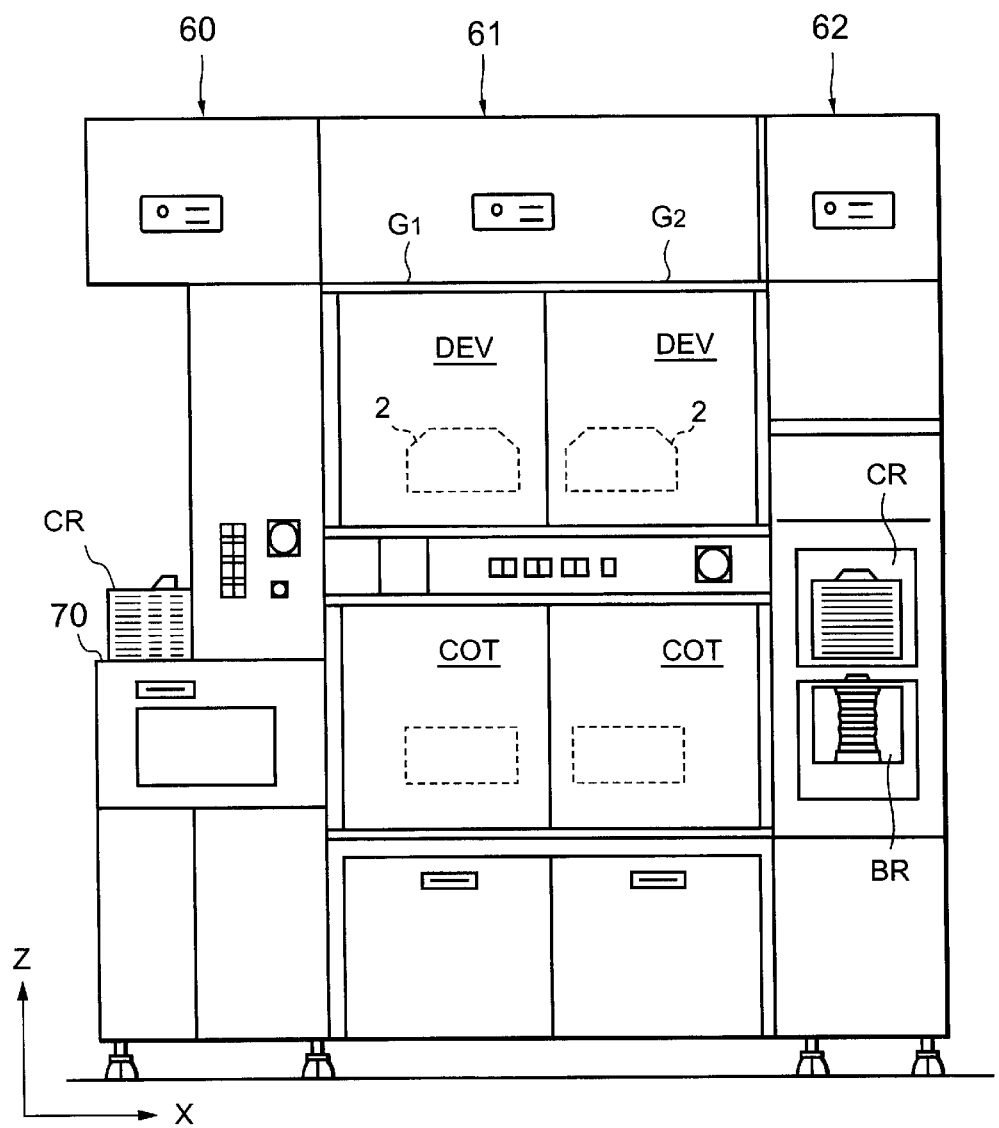
FIG. 7 is a front layout view showing the entire structure of the coating and developing system to which the embodiment of the present invention is applied.
Figure 8:
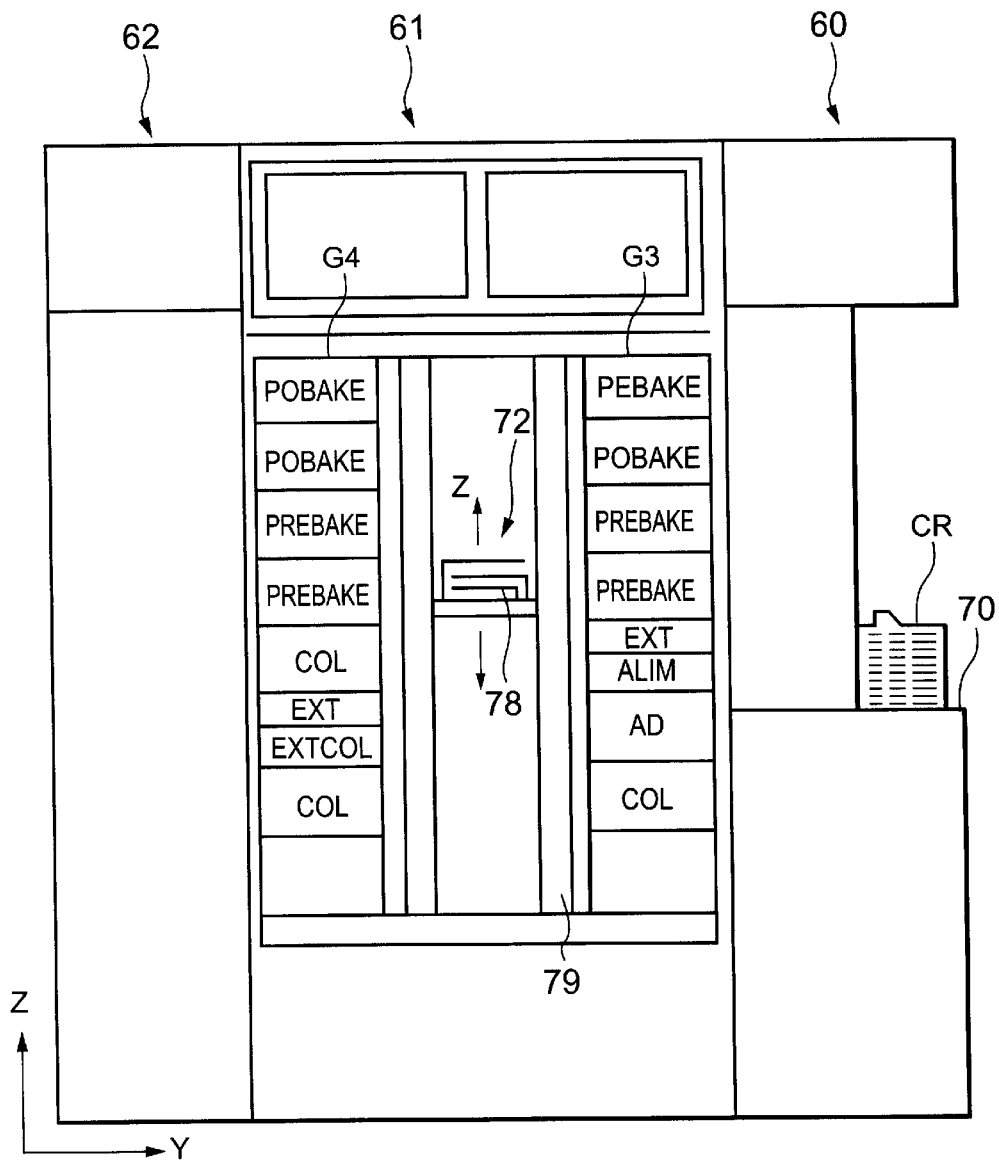
FIG. 8 is a rear layout view showing the entire structure of the coating and developing system to which the embodiment of the present invention is applied.

This developing processing apparatus is preferably applied to a coating and developing processing system shown in FIG. 6 to FIG. 8.

As shown in FIG. 6, this coating and developing processing system includes a cassette section 60 for taking out wafers W one by one from a cassette CR in which wafers W are housed, a processing section 61 for performing resist solution coating and developing processing for the wafer W which has been taken out by the cassette section 60, and an interface section 62 for delivering the wafer W coated with a resist solution to an aligner not shown.

In the cassette section 60, provided are four projecting portions 70a for positioning and holding the cassettes CR and a first sub arm mechanism 71 for taking the wafer W out from the cassette CR held by the projecting portion 70a. The sub-arm mechanism 71 is configured to be rotatable in a θ-direction and has a function of delivering the wafer W taken out from the cassette to the part of a main arm mechanism 72 provided in the processing section 61.

The delivery of the wafer W between the cassette section 60 and the processing section 61 is conducted via a third processing unit group G3. The third processing unit group G3 is made up by a plurality of processing units being stacked in a vertical arrangement as shown in FIG. 8. More specifically, the third processing unit group G3 is made up by a cooling unit (COL) for performing cooling the wafer W, an adhesion unit (AD) for performing hydrophobic processing to enhance fixedness of a resist solution to the wafer W, an alignment unit (ALIM) for performing alignment of the wafer W an extension unit (EXT) for allowing the wafer W to wait therein, two prebaking units (PREBAKE) each for performing heat processing after resist coating, and a post-exposure baking unit (PEBAKE) and a postbaking unit (POBAKE) each for performing heat processing after exposure processing which are tiered in order from the bottom to the top.

It should be noted that a fourth processing unit group G4 is provided on the opposite side to the third processing unit group G3 with the main arm mechanism 72 interposed as shown in FIG. 8, but the fourth processing unit group G4 is configured nearly in the same manner as the third processing unit group G3, and thus the detail description thereof is omitted.

As shown in FIG. 6, around the main arm mechanism 72, first to fifth processing unit groups G1 to G5 including the aforesaid third and fourth processing unit groups G3 and G4 are provided to surround the main arm mechanism 72. As in the aforesaid third and fourth processing unit groups G3 and G4, the other processing unit groups G1, G2, and G5 are each configured such that various kinds of processing units are stacked in the vertical direction.

The developing processing apparatus (DEV) of this embodiment is provided in the first and second processing unit groups G1 and G2 respectively as shown in FIG. 7. The first and second processing unit groups G1 and G2 are each made up by a resist coating apparatus (COT) and the developing processing apparatus (DEV) being stacked in the vertical direction.

On the other hand, the main arm mechanism 72 includes a cylindrical guide 79 provided to extend in a vertical direction and a main arm 78 which is vertically moved along the guide 79. Further, the main arm 78 is rotated on a plane and moved forward and rearward. Accordingly, the main arm 78 is moved in the vertical direction, thereby allowing the wafer W to freely get access to each of the processing units in the first to fifth processing unit groups G1 to G5.

The delivery of the wafer W from the first sub-arm mechanism 71 to the main arm mechanism 72 is conducted via the extension unit (EXT) and the alignment unit (ALIM) in the third processing unit group G3.

The main arm mechanism 72 which has received the wafer W first carries the wafer W into the adhesion unit (AD) in the third processing unit group G3, and hydrophobic processing is performed. Subsequently, the wafer W is carried out from the adhesion unit (AD) and subjected to cooling processing in the cooling unit (COL).

The wafer W which has been subjected to cooling processing is positioned to face the resist solution coating apparatus (COT) of the first processing unit group G1 (or the second processing unit group G2) and carried thereinto by the main arm mechanism 72. The wafer W which has been coated with a resist solution by the resist solution coating apparatus (COT) is unloaded by the main arm mechanism 72 and subjected to heat processing for evaporating a resist solvent in the heat processing unit (PEBAKE) of the third or fourth processing unit group G3 or G4.

Next, after being cooled in the cooling unit (COL), the wafer W is delivered to the second sub-arm mechanism 64 provided in the interface section 62 via the extension unit (EXT) of the fourth processing unit group G4.

The second sub-arm mechanism 64, which has received the wafer W, houses the received wafers W one after another into a buffer cassette (BUCR). Thereafter, when a reception signal is sent from the not shown aligner, the sub-arm mechanism 64 delivers the wafers housed in the buffer cassette (BUCR) to the aligner one by one. After the completion of the exposure by the aligner, the exposed wafer is received by the sub-arm mechanism 64 and the peripheral portion of the wafer is subjected to edge exposure in a width of, for example, 2 mm by an edge exposure unit (WEE).

The wafer W which has been subjected to the edge exposure is delivered to the main arm mechanism 72 via the fourth processing unit group G4 in reverse order to the above, and the main arm mechanism 72 delivers the exposed wafer W to the post-exposure baking unit (PEBAKE). Thereby the wafer W is subjected to heat processing and thereafter cooling processing to a predetermined temperature in the cooling unit (COL).

Subsequently, the wafer W is put into the developing apparatus (DEV) of this embodiment by the main arm mechanism 72 to be subjected to developing processing. The wafer W after the developing processing is transferred to any of the baking units to be dried by heating, and is thereafter ejected to the cassette section 60 via the third extension unit (EXT) of the third processing unit group G3.

It should be noted that the fifth processing unit group G5 is selectively provided and configured in the same manner as the fourth processing unit group G4 in this embodiment. Further, the fifth processing unit group G5 is held to be movable by rails 65, so that maintenance service can be easily conducted to the main arm mechanism 72 and the first to fourth processing unit groups G1 to G4.

When the developing processing apparatus of the present invention is applied to the coating and developing processing system shown in FIG. 6 to FIG. 8, parallel processing for a plurality of wafers can be easily performed, whereby coating and developing processing steps for the wafers W can be very efficiently conducted. Further, the processing units are stacked in a vertical arrangement, thereby remarkably reducing the footprint of the system.

The present invention is not limited to the above-described one embodiment, but various modifications may be made within the scope of the present invention.

Figure 9:
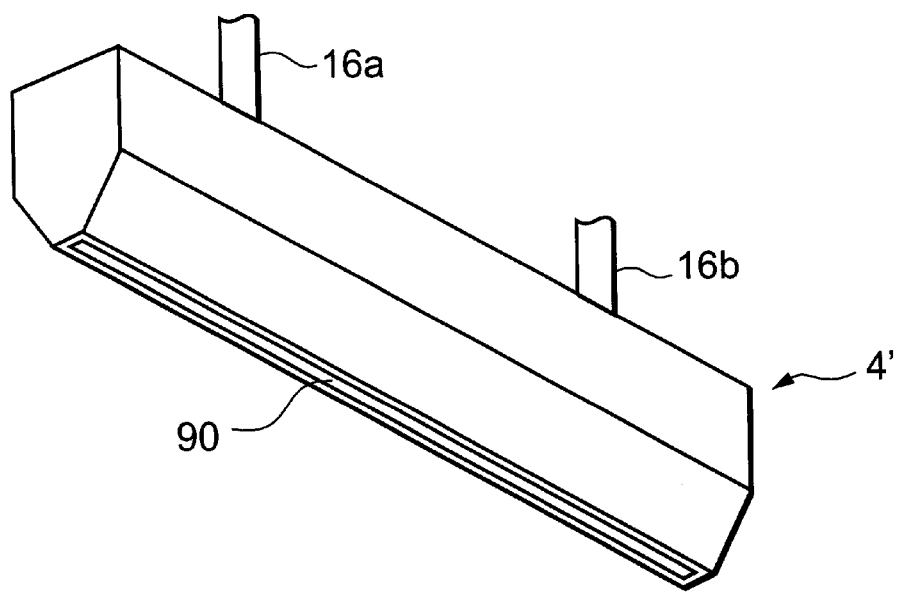
FIG. 9 is a perspective view showing another embodiment of the present invention.

For example, in the aforesaid one embodiment, the linear nozzle 4 has a plurality of circular discharge ports 15, but a nozzle 4' having a discharge port 90 in the form of one slit (or a plurality of slits) as shown in FIG. 9 is also suitable.

Figure 10A:
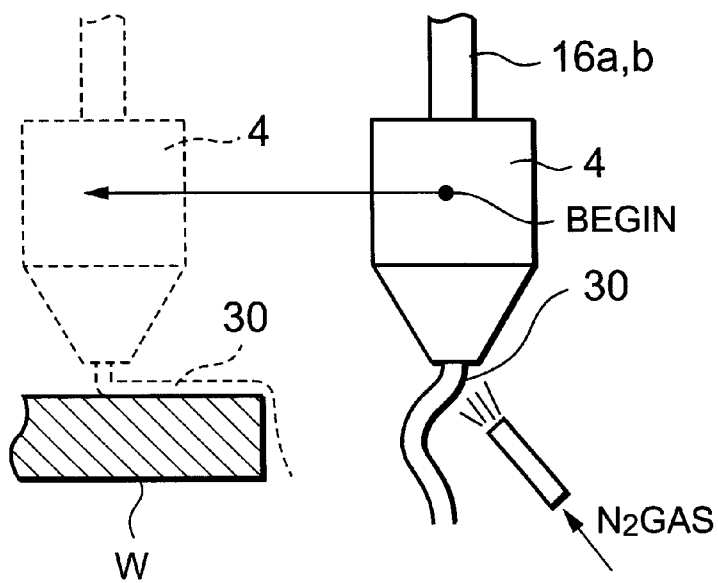
FIGS. 10A and 10B are diagrammatic views showing the another embodiment of the present invention.

Moreover, though the discharge resistance is imparted by using the resistance bar 6 in the aforesaid one embodiment, but not limited to that, means capable of imparting resistance to discharge is suitable. The same operation effect can be obtained by, for example, blasting $N_2$ blow through an $N_2$ nozzle to the under face of the nozzle 4 as shown in FIG. 10A.

Figure 10B:
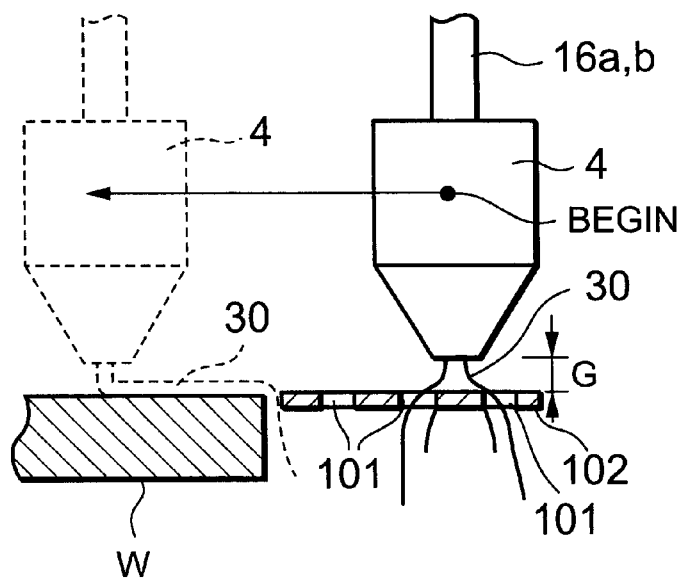

It is also suitable to dispose a mesh plate 102 in which many holes 101 are bored in place of the resistance bar 6 as shown in FIG. 10B. The many holes 101 come to function as a drain passage for the developing solution. The same operation effect can be obtained with this configuration.

As has been described, according to the present invention, it is possible to obtain a developing processing apparatus capable of uniformly discharging the developing solution from all the discharge ports especially even in the case where the discharge pressure for the developing solution is low in development by the scan method using a linear nozzle or a slit nozzle.

Next, another embodiment of the present invention will be explained.

Figure 11:
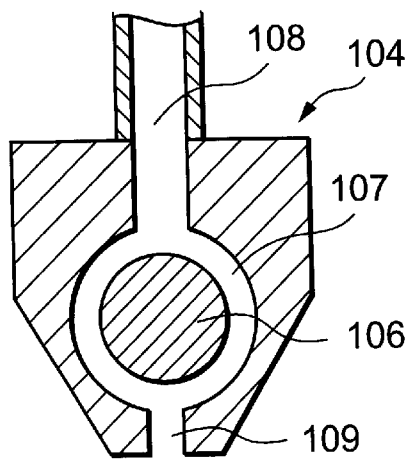
FIG. 11 is a sectional view of a linear nozzle showing still another embodiment of the present invention.

In this embodiment, a resistance bar 106 is provided in a nozzle 104 as shown in FIG. 11. A cylindrical buffer chamber 107 is provided in the nozzle 104, and the resistance bar 106 is disposed nearly at the center thereof. A developing solution is supplied from a supply passage 108 above the buffer chamber 107 into the buffer chamber 107 and hits once against the resistance bar 106, then supplied onto the wafer W from a discharge port 109 provided under the buffer chamber 107.

In this embodiment, the developing solution hits exactly once against the resistance bar 106 and then supplied onto the wafer W, thereby reducing an impact at the time of the developing solution being supplied onto the wafer W compared with the case where the developing solution is supplied directly onto the wafer W. Further, the developing solution is likely to spread in an axial direction of the resistance bar 106, making the discharge amount of the developing solution in a longitudinal direction of the nozzle 104 more uniform.

As for material of the resistance bar 106, one having a hydrophilic property such as quartz or the like is preferable. That is because the material causes the developing solution to spread out more reliably in the axial direction of the resistance bar 106.

Figure 12:
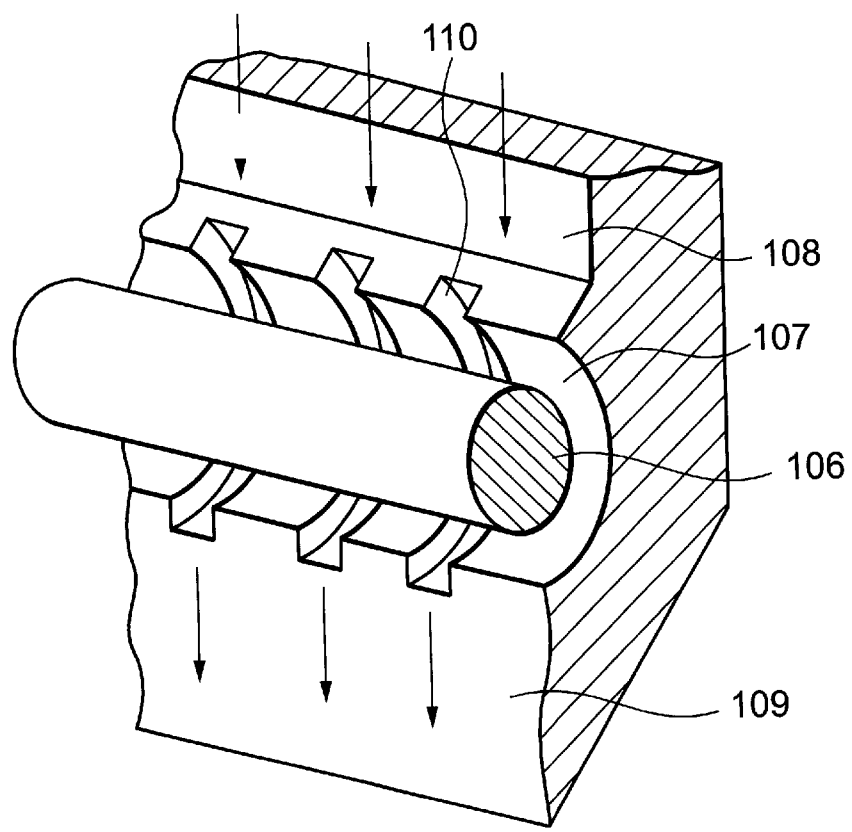
FIG. 12 is a sectional view of a linear nozzle showing a modification of the embodiment shown in FIG. 11.

It is also suitable to provide grooves 110 in a circumferential direction of the inner wall of the buffer chamber 107 at predetermined intervals in the axial direction as shown in FIG. 12. This allows the developing solution supplied from the supply passage 108 to be guided by the grooves 110 in the buffer chamber 107 and discharged more reliably (with no break in the solution) from the discharge port 109.

Figure 13:
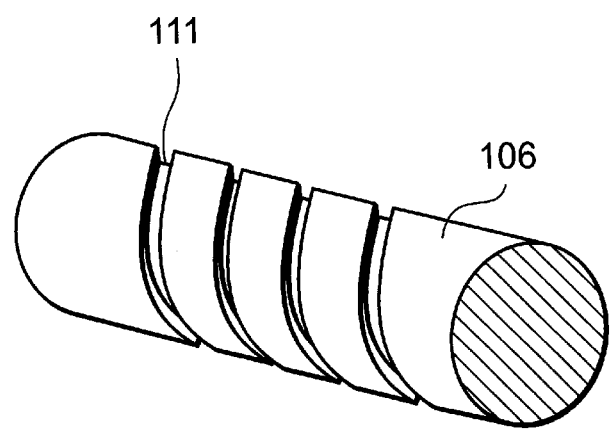
FIG. 13 is a perspective view of a rod member as discharge resistance imparting means showing an embodiment other than the embodiment shown in FIG. 11.

A spiral groove 111 may be provided on the surface of the resistance bar 106 as shown in FIG. 13 for the same purpose as that of the embodiment shown in FIG. 12.

Next, still another embodiment of the present invention will be explained.

Figure 14:
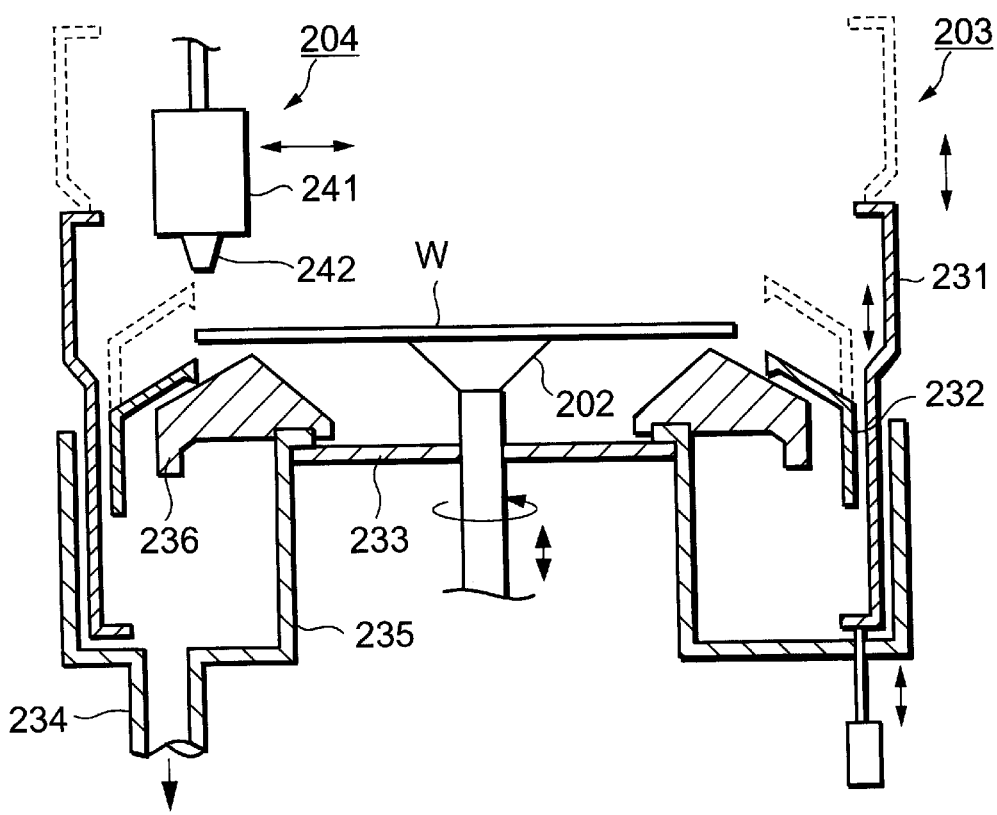
FIG. 14 is a sectional view showing an embodiment of a solution processing apparatus according to the present invention.
Figure 15:
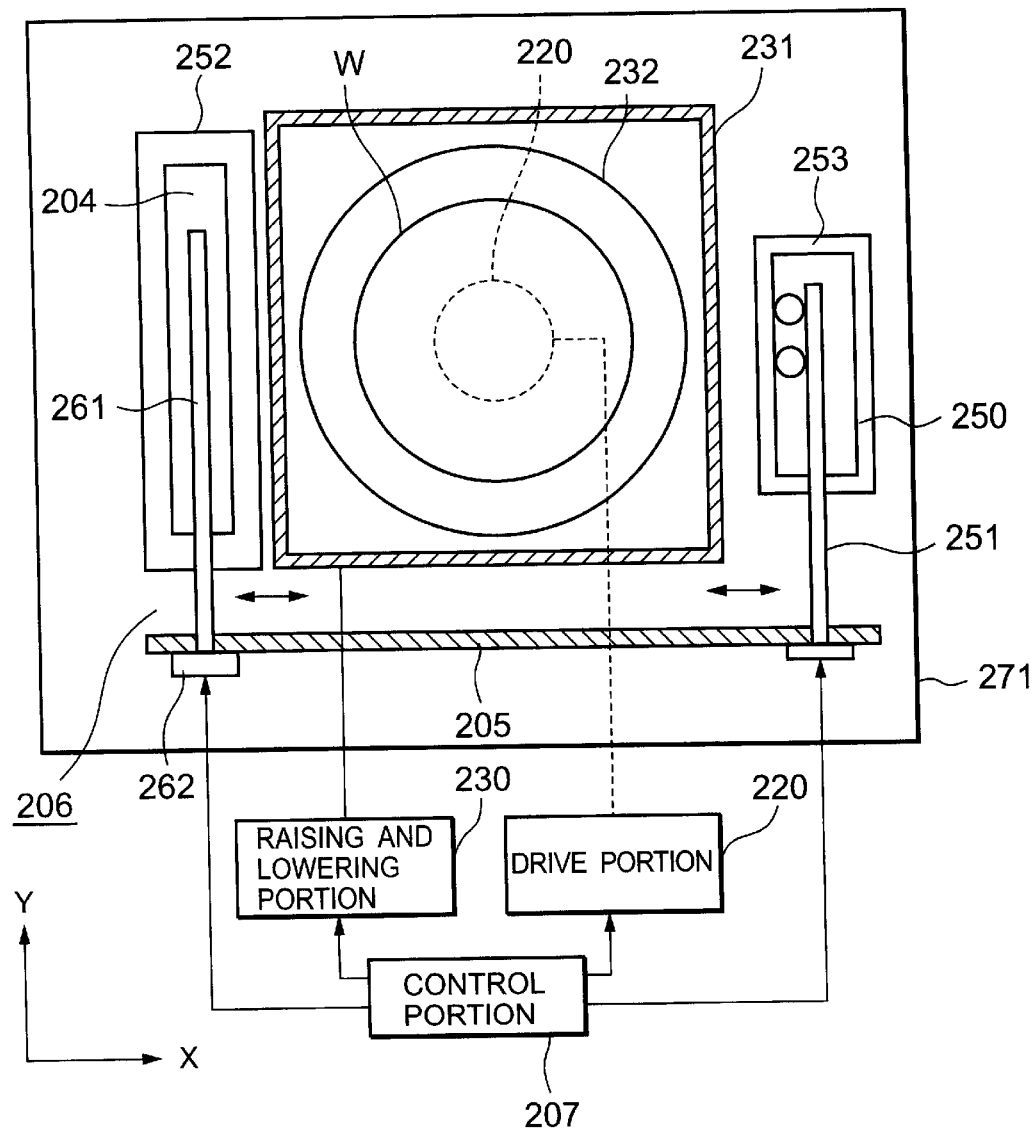
FIG. 15 is a plan view showing the embodiment of the solution processing apparatus according to the present invention.

FIG. 14 and FIG. 15 are schematic views showing this embodiment. Numeral 202 denotes a spin chuck forming a substrate holding portion for vacuum sucking the central portion of a rear face of a wafer W that is a substrate and nearly horizontally holding the wafer W. The spin chuck is configured to rotate and ascend and descend by a drive portion 220.

A cup 203 is provided to surround the side of the wafer W in the state where the wafer W is suction held by the spin chuck 202, and the cup 203 is composed of an outer cop 231 and an inner cup 232 each of which is ascendable and descendable. The inner cup 232 is formed such that the upper side of a cylinder inclines inward to the top and an upper side opening portion is smaller in diameter than a lower side opening portion, and the inner cup 232 is configured to ascend and descend together with the outer cup 231 within part of a moving range of the outer cup 231 when the outer cup 231 ascends by means of a raising and lowering portion 230.

The lower portion of the cup 203 is composed of a circular plate 233 surrounding the periphery of the spin chuck 202 and a solution catch portion 235 in which a recessed portion is formed around the entire periphery of the circular plate 233 and a drain outlet 234 is formed at the bottom face. The outer cup 231 (and the inner cup 232) is housed at the slightly inner side of the side wall of the solution catch portion 235, and the aforesaid recessed portion and the cup 203 surround the side of the wafer W from an upper level to a lower level of the wafer W. A ring body 236 with a mountain-shaped cross section of which the upper end is close to the rear face of the wafer W is provided in the vicinity of the rim portion of the circular plate 233.

Figure 16:
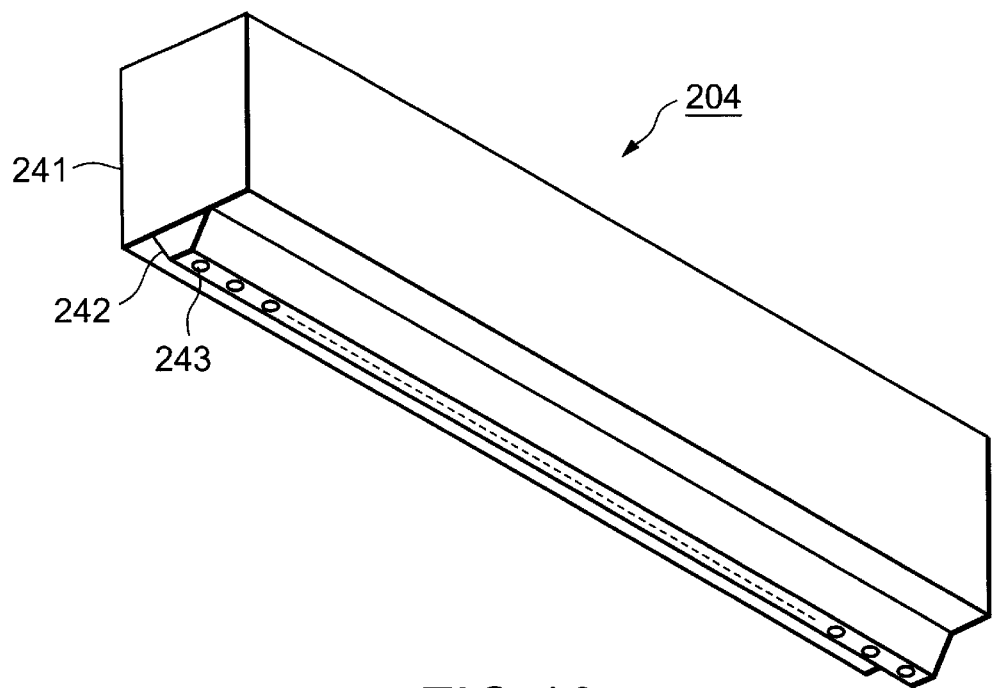
FIG. 16 is a perspective view showing a supply portion of the solution processing apparatus.
Figure 17:
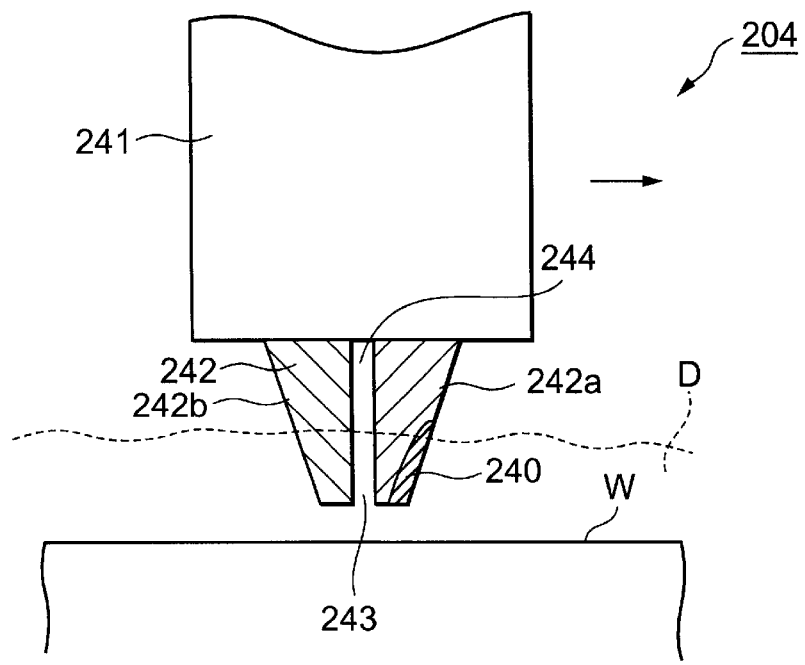
FIG. 17 is a side view showing a supply nozzle of the solution processing apparatus.

Subsequently, a supply nozzle 204 for supplying a developing solution that is a processing solution to the wafer W which is suction-held by the spin chuck 202 will be explained. The supply nozzle 204 includes, for example, a nozzle main body 241 in a long and narrow square bar shape to which the developing solution is supplied and a nozzle portion 242 provided at the under face thereof as shown in FIG. 16. Many discharge ports 243 are provided at the nozzle portion 242 over a length equal to or greater than that of, for example, a width of an effective area of the wafer W (an area in which devices are formed). The discharge ports 243 are connected to the nozzle main body 241 via a flowing passage 244 as shown in FIG. 17. The nozzle portion 242 here corresponds to a member composing the discharge ports 243, and the nozzle main body 241 and the nozzle portion 242 are made of a material such as polytetrafluoroethylene (PTFE), polypropylene (PP), polyethylene (PE), polyvinyl carbonate (PVC), polyacetal (POM), or the like.

The above-described supply nozzle 204 is movable in the horizontal direction as described later, and the surface of an area 240, which is an area shown by diagonally shaded in FIG. 17 on the front side in respect to a direction of movement (a direction shown by the arrow in FIG. 17) of the supply nozzle 204 and including a part where the nozzle portion 242 contacts the developing solution D on the wafer W when the developing solution D is supplied from the supply nozzle 204 to the wafer W, is hydrophobic.

In this embodiment, for example, the surface of an area 242a of the supply nozzle 204 ahead of the flow passage 244 in respect to the direction of movement is made hydrophobic to be hydrophobic, and, for example, the surface of an area 242b behind the flow passage 244 in respect to the direction of movement is made hydrophilic to be hydrophilic.

To change quality of the surfaces of the nozzle portion 242 into hydrophobic or hydrophilic here means to change the surface tensions of these surfaces. Concretely, in the case in which, for example, the surface of the nozzle portion 242 is changed in quality into hydrophobic, the surface is decreased in surface tension and in hydrophilic property to a processing solution such as the developing solution or the like, resulting in a state in which upon contacting the surface, the developing solution is rejected.

On the other hand, in the case in which the surface is changed in quality into hydrophilic, the surface is increased in surface tension and in hydrophilic property to the developing solution, resulting in a state in which when the developing solution contacts the surface, the developing solution having good wettability, adhesion strength between the surface and the developing solution becomes large.

Taking an example of change in quality of the surface of the nozzle portion 242, for example, in the case of a change into hydrophobic, plasma of fluorine compound gas is applied to an area of the nozzle portion 242 to be made hydrophobic in a not shown chamber, whereby the area is made hydrophobic. For example, $F_2$ gas, $C_2F_4$ gas, $CF_4$ gas, or the like can be used as the fluorine compound gas here, and plasma processing is performed with one of these gasses as a reaction gas.

Meanwhile, in the case of a change into hydrophilic, plasma of CO gas, $O_2$ gas, $N_2$ gas, or the like is applied to an area of the nozzle portion 242 to be made hydrophilic in a not shown chamber, whereby the area is made hydrophilic, and plasma processing is performed with one of these gasses as a reaction gas.

The supply nozzle 204 as described above is provided to be movable along a guide rail 205 provided outside the cup 203 by a first moving mechanism 206 from a waiting position (a position at one end side of the guide rail 205) shown in FIG. 15, passing above the wafer W to a position opposite to the waiting position across the wafer W.

More specifically, the guide rail 205 is provided to extend in an X-direction to be parallel, for example, to one side of the outer cup 231 shown in FIG. 15, and the first moving mechanism 206 is located at the one end side of the guide rail 205. The first moving mechanism 206, composed of an arm portion 261 and a base portion 262, supports the supply nozzle 204 by hanging it by the arm portion 261 so that the aforesaid many discharge ports 243 for the processing solution are arranged in a Y-direction and can move along the guide rail 205 via the base portion 262 that is a moving portion.

Figure 18:
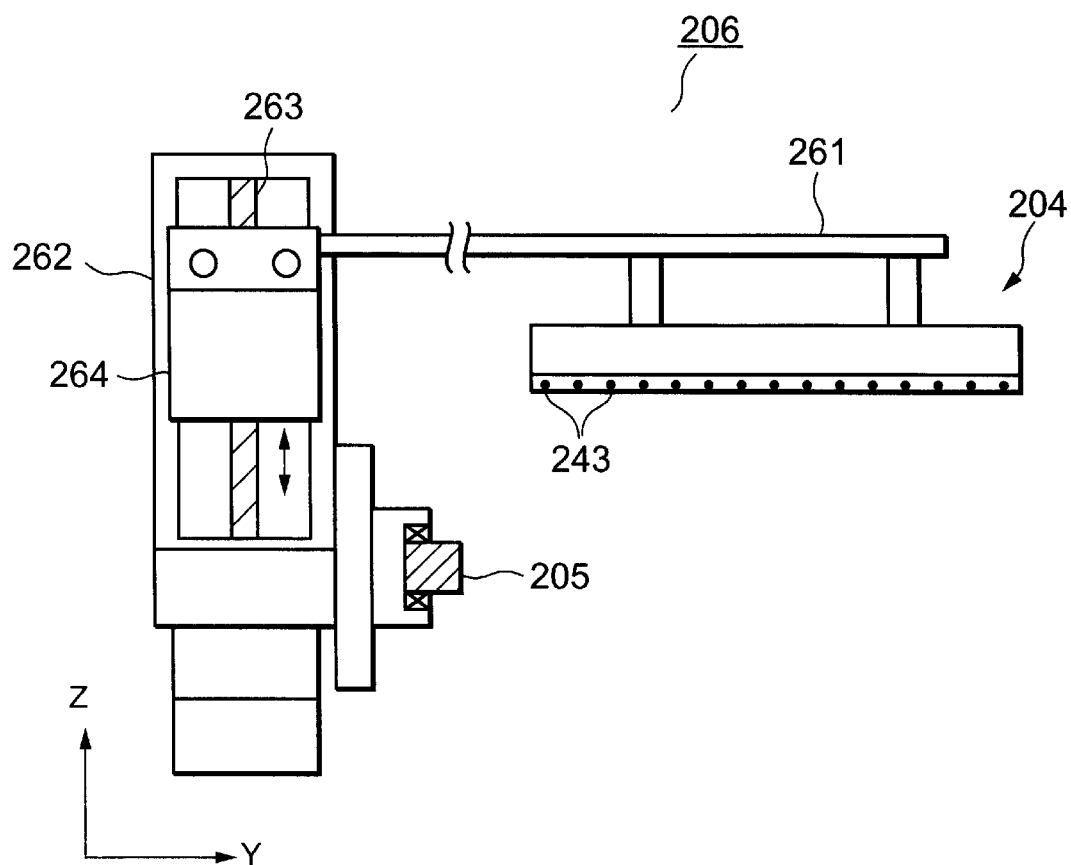
FIG. 18 is a side view showing a supply portion of the solution processing apparatus.

The base portion 262 has a raising and lowering mechanism 264 composed of, for example, a bore screw mechanism 263 as shown in FIG. 18 so as to move (raise and lower) the arm portion 261 in a Z-direction by drive force from, for example, a power source not shown such as a motor.

Numeral 250 in FIG. 15 is a rinse nozzle for supplying a rinse solution to the wafer W to rinse the surface of the wafer W. The rinse nozzle 250 is provided to be horizontally movable from a waiting position (a position at the other end side of the guide rail 205) outside the cup 203 shown in FIG. 15, passing above the wafer W, to a position opposite to the waiting position across the wafer W by, for example, a second moving mechanism 251.

The positions where the first moving mechanism 206 and the second moving mechanism 251 are shown respectively in FIG. 15 are the aforesaid waiting positions of the supply nozzle 204 and the rinse nozzle 250 during non-operation time. There provided are waiting portions 252 and 253 of the first moving mechanism 206 and the second moving mechanism 251 each composed of, for example, a plate-like body which is vertically movable.

The drive portion 220, the raising and lowering portion 230, the first moving mechanism 206, and the second moving mechanism 251 which have been described hereinbefore are individually connected to a control portion 207, thereby enabling ganged control of the respective portions, allowing the first moving mechanism 206 to perform supply (scan) of the processing solution in response to ascent and descent of the spin chuck 202 by the drive portion 220. The cup 203, the first moving mechanism 206, and the second moving mechanism 251 are formed as one unit which is enclosed by a casing 271 in a box shape to/from which the wafer W is delivered by a transfer arm not shown.

Next, operations in this embodiment will be explained. First, the spin chuck 202 is raised to a position above the cup 203 and the wafer W which has been already coated with a resist and subjected to exposure processing in the prior steps is delivered from the transfer arm not shown to the spin chuck 202. The spin chuck 202 is lowered so that the wafer W is placed at a predetermined position shown by the solid line in FIG. 14. Incidentally, the outer cup 231 and the inner cup 232 are both in a state of being lowered at this time.

Subsequently, the first moving mechanism 206 is guided along the guide rail 205 to a position corresponding to a portion between the outer cup 231 and the rim of the wafer W and subsequently lowered therefrom to the waiting position outside the rim of the wafer W. At this time, the position (height) of the supply nozzle 204 is set at the height where supply of the developing solution is performed for the wafer W, and thus the discharge ports 243 are located at positions higher than the level of the wafer W surface by, for example, about 1 mm.

Figure 19A:
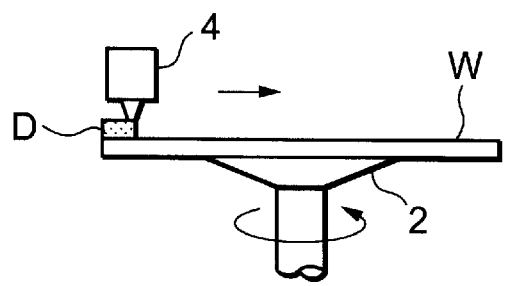
FIGS. 19A to 19E are process views showing operations of the solution processing apparatus.
Figure 19B:
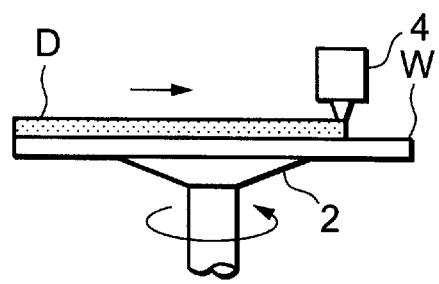

Then, as shown in FIGS. 19A and 19B, the supply nozzle 204 is moved from one end side to the other end side of the wafer W (moved from left to right in FIGS. 19A and 19B) while starting discharge of the developing solution D, thereby forming a solution film of with a height of, for example, 1.2 mm on the surface of the wafer W. At this time, the tip of the supply nozzle 204 is located at a position contacting the developing solution D which has been supplied on the wafer surface, and the supply nozzle 204 is scanned in one direction with the tip thereof contacting the developing solution D on the wafer, whereby the developing solution D on the wafer is spread out by the tip portion of the supply nozzle 204, with the result that the developing solution D is heaped uniformly on the entire surface of the wafer W.

The movement of the supply nozzle 204 at this time is performed at a scan speed of, for example, about 50 mm/sec in such a manner that the center of the discharge area where the discharge ports 243 of the supply nozzle 204 are arranged passes through a position above the center of the wafer W.

Then, the scan of the supply nozzle 204 and the supply of the developing solution D are stopped above the inner cup 232 on the aforesaid other end side of the wafer W. When a plurality of discharges of the developing solution D to the wafer W are required here, the supply nozzle 204 is raised to the height where it is allowed to scan, for example, 1 mm above the surface of the wafer W at the aforesaid stop position, and then, for example, performs supply of the developing solution D in such a manner to retrace the scanned route.

Figure 19C:
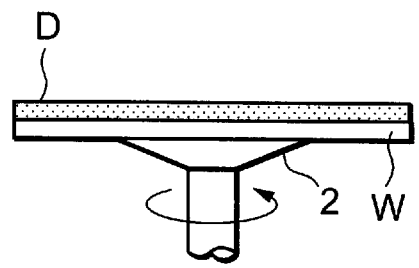

After the completion of the coating of the developing solution D, rest development is performed with the developing solution D being heaped on the surface of the wafer W as shown in FIG. 19C. The first moving mechanism 206 returns to the waiting portion 252, and the second moving mechanism 251, replacing the first moving mechanism 206, moves from the waiting portion 253 toward the wafer W.

Figure 19D:
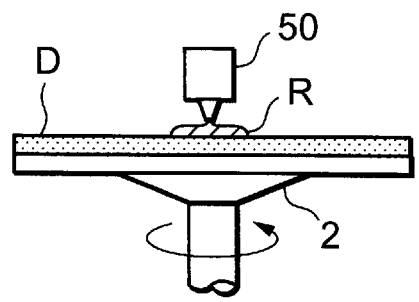
Figure 19E:
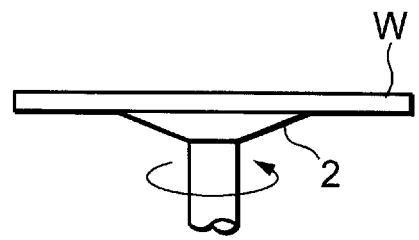

Then, positioning is conducted such that a discharge portion of the rinse nozzle 250 is located above the center of the wafer W as shown in FIG. 19D and the spin chuck 202 is rotated, and then a rinse solution R, for example, pure water, is supplied from the rinse nozzle 250 to the central portion of the wafer W, causing the rinse solution R to spread out from the central portion of the wafer W to the peripheral portion by centrifugal force of the wafer W to thereby rinse away the developing solution D. Thereafter, the wafer W is subjected to steps such as drying by spinning and the like to complete developing processing.

At this time, the developing solution D and the rinse solution R flow downward: along the inner cup 232 to be stored in the solution catch portion 235, and these solutions are drained from the drain outlet 234 through a drain line not shown.

As has been described, in this embodiment according to the present invention, since the area 242a of the nozzle portion 242 of the supply nozzle 204 ahead of the flow passage 244 in respect to the direction of movement is changed in quality into hydrophobic, even in the case in which the supply nozzle 204 is scanned at a speed of about 50 mm/sec to perform solution heaping of the developing solution D, the so-called phenomenon of the developing solution D flowing ahead, in which the developing solution D flows to a position ahead of the supply nozzle 204 in respect to the direction of movement, can be prevented, whereby developing processing with high uniformity can be performed.

Figure 20:
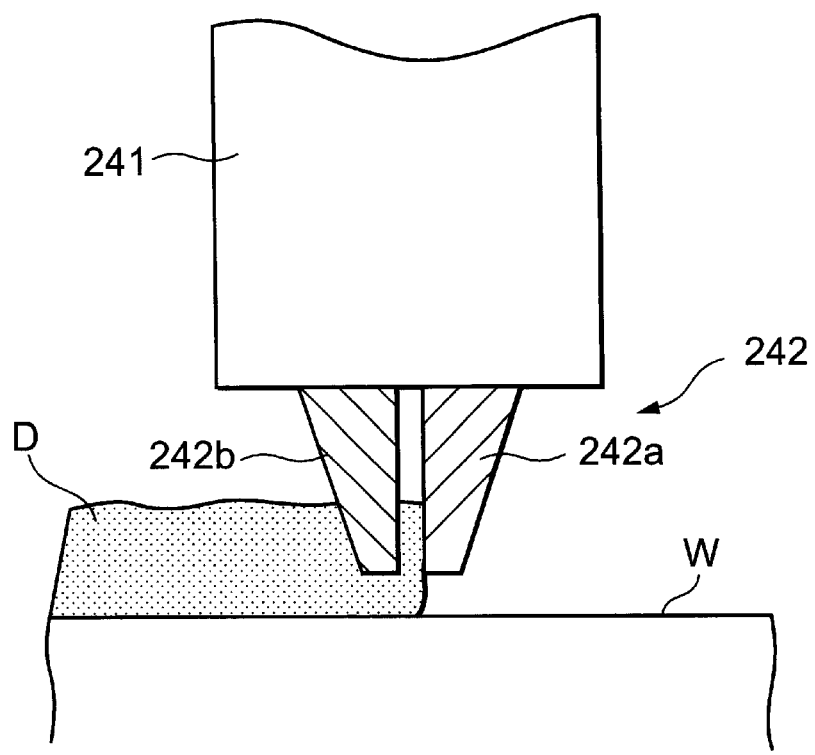
FIG. 20 is a side view showing a function of the supply nozzle of the solution processing apparatus.

In other words, during the performance of solution heaping of the developing solution D, even if the developing solution D discharged from the discharge ports 243 of the supply nozzle 204 to the surface of the wafer is likely to flow ahead of the nozzle portion 242, the front side of the nozzle portion 242 being hydrophobic, the developing solution D is rejected by the surface to be returned backward. Therefore, the developing solution D is hardly to flow ahead of the flow passage 244 of the supply nozzle 204 as shown in FIG. 20, with the result that occurrence of the phenomenon of the developing solution D flowing ahead can be prevented. Accordingly, the degrees of progress of development can be made uniform in all areas of the wafer W, thereby increasing uniformity in developed line width.

Further, when a portion of the nozzle portion 242 of the supply nozzle 204 behind the flow passage 244 in respect to the direction of movement is changed in quality into hydrophilic, the surface is great in wettability to the developing solution D and thus the developing solution D easily adheres to the surface, resulting in a decrease in the developing solution D which is likely to flow ahead of the nozzle portion 242. Furthermore, the developing solution D which has flowed ahead and has been rejected by the surface of the front side of the nozzle portion 242 also easily adheres to the hydrophilic surface, so that occurrence of the phenomenon of the developing solution D flowing ahead can be further prevented.

Moreover, since the developing solution D easily attaches to the hydrophilic surface, the developing solution D is hardly disturbed even if the hydrophilic surface contacts the developing solution D on the wafer surface. When the solution heaping of the developing solution D is performed by scanning the supply nozzle 204, the developing solution D is pushed to spread out by the hydrophilic surface, thereby performing solution heaping with higher uniformity, resulting in further increased uniformity in developed line width.

Figure 21A:
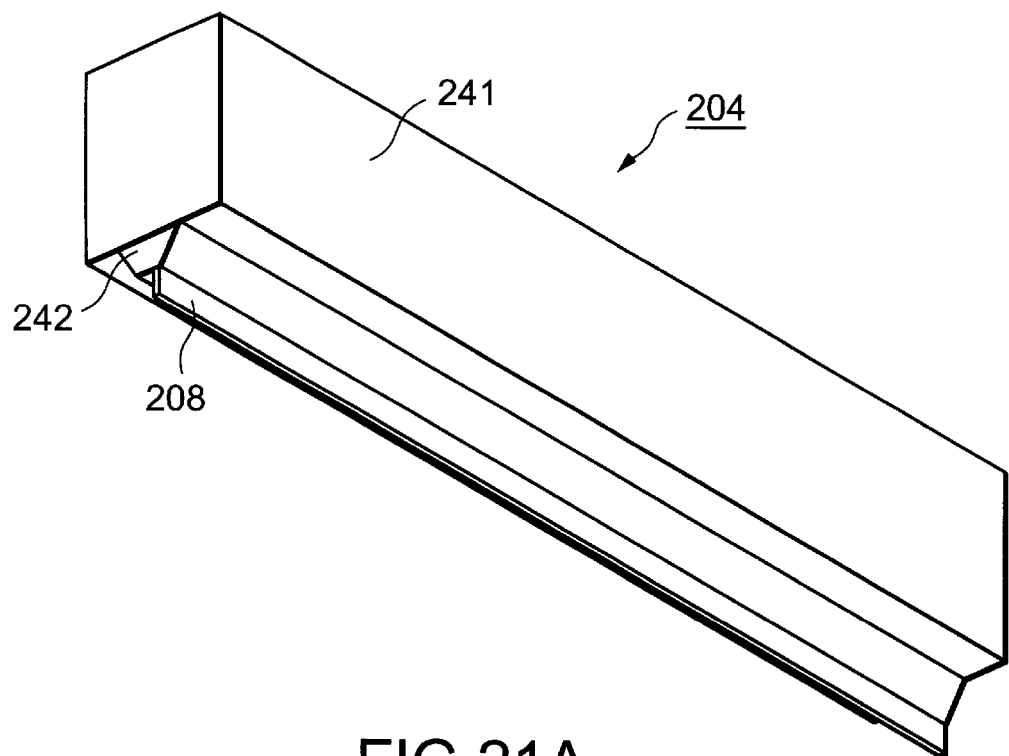
FIGS. 21A and 21B are perspective views each showing a supply nozzle of another embodiment of the solution processing apparatus according to the present invention.

Subsequently, another embodiment of the present invention will be explained with reference to FIG. 21A, in which a supply nozzle 204 is provided with a nearly vertical guide 208, adjoining to a flow passage 244, on the front side of a nozzle 242 in respect to a direction of movement along a longitudinal direction of the nozzle portion 242. The guide 208 guides the developing solution discharged from discharge ports 243 to the wafer surface. The height of the guide 208 and the height of the supply nozzle 204 during the supply are determined so that when the developing solution is supplied to the wafer surface, the tip of the guide 208 is located at a position slightly above the wafer surface.

Figure 21B:
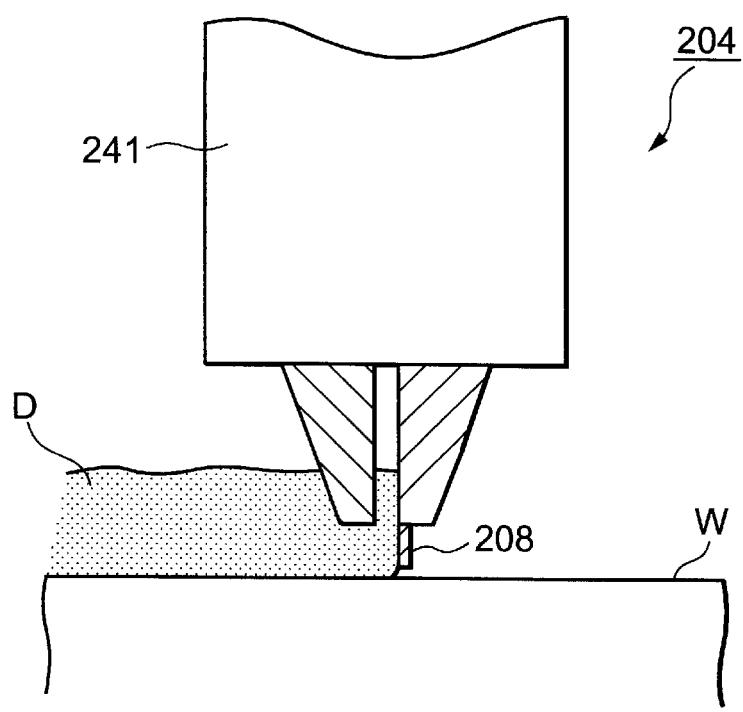

In the above-described configuration, since the guide 208 is provided adjoining to the flow passage 244 at the discharge ports 243, the developing solution D discharged from the discharge ports 243 flows along the guide 208 toward the wafer surface to be supplied thereto. At this time, the guide 208 is provided ahead of the nozzle 204 in respect to the direction of movement thereof and the tip of the guide 208 is located near the wafer surface, and thus even if the developing solution D is likely to flow ahead of the supply nozzle 204, the developing solution D hits against the guide 208 and the flow thereof is obstructed by the guide 208 as shown in FIG. 21B. Since the developing solution D can not flow to the position ahead of the guide 208 in respect to the direction of movement, the phenomenon of the developing solution flowing ahead is prevented, so that developing processing with high uniformity can be performed.

Figure 22:
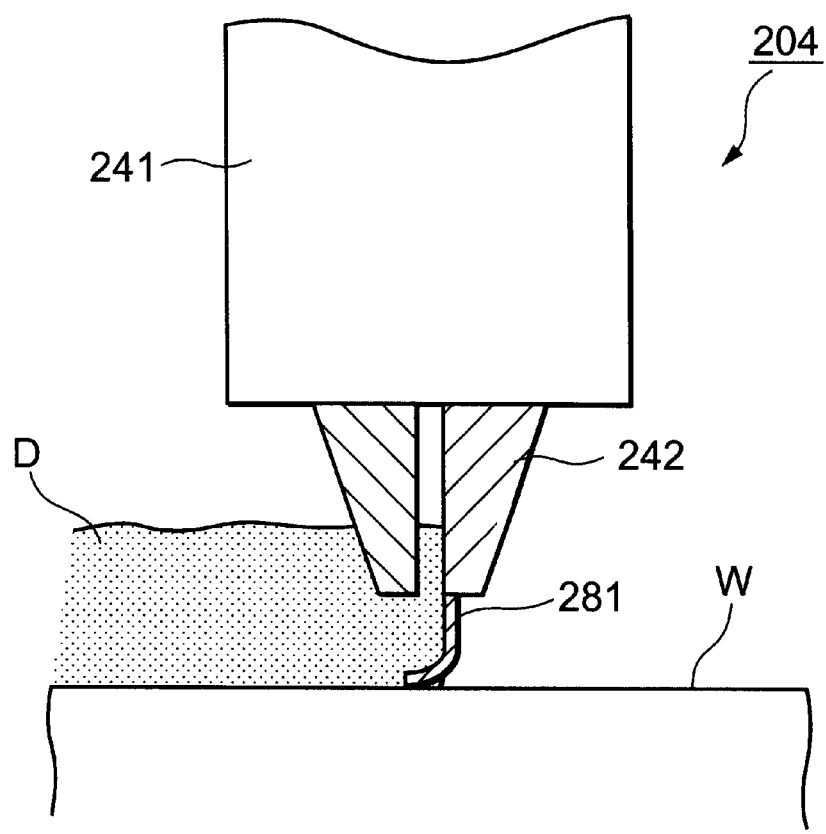
FIG. 22 is a side view showing a supply nozzle of still another embodiment of the solution processing apparatus according to the present invention.

As shown in FIG. 22 here, the tip of a guide 281 may be configured to curve rearward in respect to the direction of movement. The tip of the guide 281 in this configuration is located behind the front positions of the discharge ports 243 in respect to the direction of movement on the wafer surface, so that the developing solution D discharged from the discharge ports 243 flows along the guide 281 to be supplied to a position behind in respect to the direction of movement on the wafer surface. The developing solution D is prevented from flowing ahead by the guide 281 at this position, whereby the phenomenon of the developing solution D flowing ahead is further prevented, so that developing processing with high uniformity can be performed. It should be noted that the same effect can be obtained even if the tip of the guide 281 is bent rearward in respect to the direction of movement in this embodiment.

The above-described developing apparatus is applicable to the system shown in FIG. 6 to FIG. 8 as the aforesaid embodiments.

As has been described, in the present invention, the aforesaid effect can be obtained if the part of the supply nozzle 204 to be made hydrophobic is not the entire part ahead of the flow passage 244 in respect to the direction of movement, but only a part ahead of the flow passage 244 in respect to the direction of movement and contacting the developing solution supplied on the wafer surface. Further, a part of the supply nozzle 204 behind the hydrophobic surface in respect to the direction of movement is made hydrophilic, whereby developing processing with higher uniformity can be performed. The aforesaid effect can be obtained, however, only if the part of the supply nozzle 204 to be made hydrophilic is not the entire part behind the flow passage 244 in respect to the direction of movement, but only a part behind the flow passage 244 in respect to the direction of movement and contacting the developing solution supplied on the wafer surface.

A technique of making the surface of the supply nozzle 204 hydrophobic or hydrophilic is not limited to the aforesaid embodiments, but it is suitable that a hydrophobic material (a hydrophilic material) is applied to a part of the nozzle portion 242 made of the aforesaid material such as PTFE to be made hydrophobic (hydrophilic), thereby making the part hydrophobic (hydrophilic).

Figure 23A:
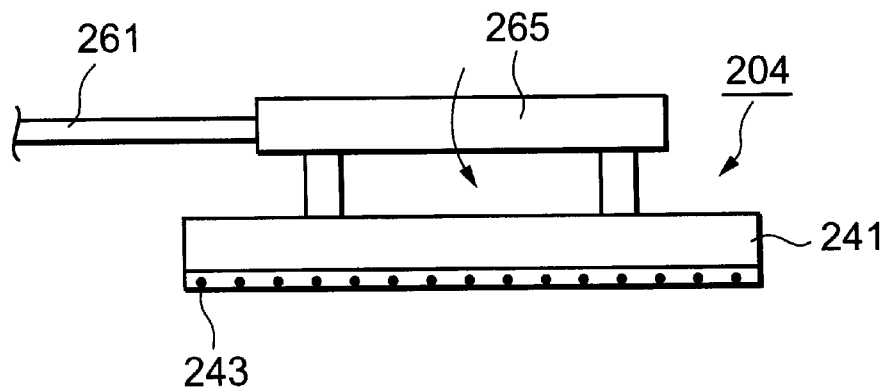
FIGS. 23A and 23B are side views showing a supply nozzle of another embodiment of the solution processing apparatus.
Figure 23B:
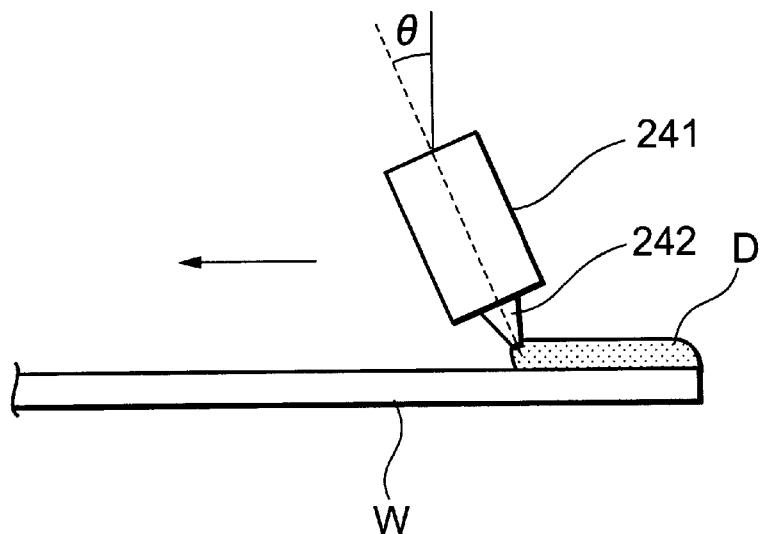

Further, it is also suitable to support the supply nozzle 204 by hanging it by a rotating shaft portion 265 on the tip side of the arm portion 261 so as to rotate the rotating shaft portion 265 to the right and the left by a driving mechanism not shown to incline a direction in which a processing solution is discharged from the supply nozzle 204 back and forth in the X-direction relative to a downward vertical direction as shown in FIGS. 23A and 23B. More specifically, the supply nozzle 204 may be inclined an angle θ for the discharge ports 243 to face the reverse direction to the direction of movement thereof during the solution heaping of the developing solution, and then the discharge of the developing solution and the scan of supply nozzle 204 are started. In this case, as the discharge ports 243 face the reverse direction to the direction of movement, the phenomenon of developing solution flowing ahead can be further prevented.

Moreover, in the configuration in which a guide is provided, the materials of the nozzle portion 242 and the guide are not limited. It is preferable, however, that if forward parts of the nozzle portion 242 and the guide in respect to the direction of movement and contacting the developing solution supplied on the wafer surface are made hydrophobic, the phenomenon of developing solution flowing ahead can be further prevented. Moreover, it is preferable that if a part behind the hydrophobic surface in respect to the direction of movement is made hydrophilic, developing processing with higher uniformity can be performed.

Next, yet another embodiment of the present invention will be explained.

Figure 24:
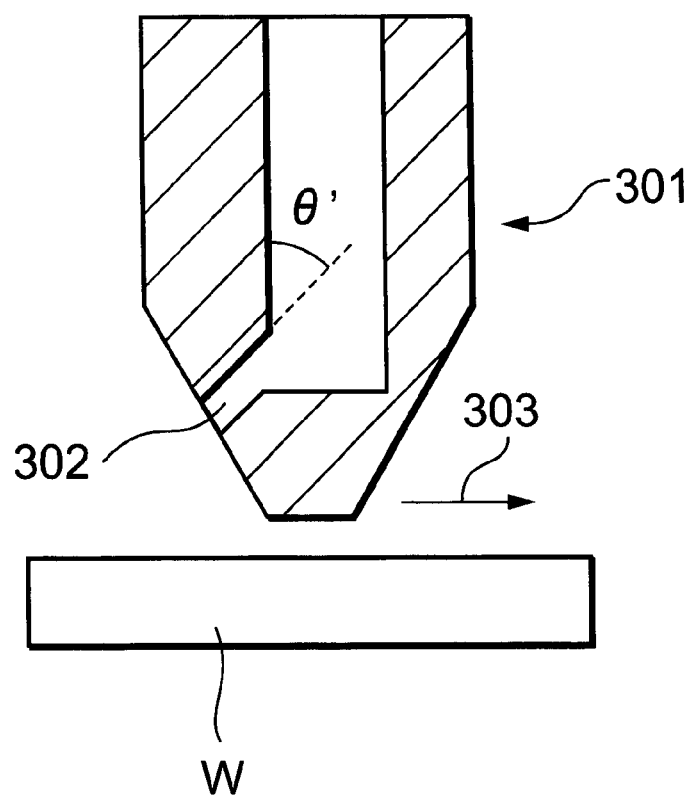
FIG. 24 is a sectional view showing a supply nozzle of another embodiment of the solution processing apparatus.

Though the supply nozzle 204 is inclined during the solution heaping for the discharge ports 243 to face the reverse direction to the direction of movement in the embodiment shown in FIG. 23, discharge ports 302 are inclined an angle θ' in stead of a supply nozzle 301 itself being inclined as shown in FIG. 24 in this embodiment. The supply nozzle 301 is scanned toward an opposite direction 303 to the side where the discharge ports 302 of the supply nozzle 301 are exposed. In this case, when the supply nozzle 301 is scanned in the opposite direction to the aforesaid direction, the wafer W may be rotated 180° by way of example.

The phenomenon of developing solution flowing ahead can also be prevented by this embodiment.

The present invention is not limited to the above-described embodiments.

For example, the solution processing apparatus of the present invention is applicable not only to developing processing but also to coating processing of a resist, and applicable to a solution processing apparatus of the type of forming a solution film of a processing solution while relatively rotating a substrate and a supply nozzle.

Further, a semiconductor wafer is given as an example of a substrate to be processed in the above-described one embodiment, but the substrate is not limited to that. The apparatus may perform developing processing, for example, for a glass substrate for fabricating an LCD.

As has been described, according to the present invention, a phenomenon, in which a processing solution flows to a position ahead of a processing solution supply position of a supply nozzle on the surface of a substrate in respect to a direction of movement of the supply nozzle, can be prevented, whereby degrees of progress of the solution processing within a plane of a substrate are made uniform, so that solution processing with high uniformity can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solution processing apparatus for supplying a developing solution to a substrate in a stationary state to thereby perform predetermined processing, comprising:

a substrate holding mechanism configured to horizontally hold the substrate;

a solution supply mechanism configured to supply the developing solution;

a linear nozzle including a solution inlet port which communicates with the solution supply mechanism, and a solution discharge port having a dimension corresponding to that of the substrate;

a nozzle moving mechanism configured to scan-move the linear nozzle between a home position and a use position such that the linear nozzle moves along the substrate held on the substrate holding mechanism, said home position being away from the substrate holding mechanism, and said use position being right above the substrate holding mechanism;

a plate or a rod member for providing resistance for a developing solution discharged from the linear nozzle, thereby causing the developing solution to be discharged with a reduced pressure, said plate or rod member being located at a solution discharge start position horizontally away from the substrate holding mechanism and between the home position and the use position, the plate or rod member being located close to an under face of the linear nozzle, and having a width slightly greater than the dimension of the solution discharge port; and a control portion which controls the solution supply mechanism and the nozzle moving mechanism such that the linear nozzle located right above the plate or rod member is scan-moved to the use position when the linear nozzle starts discharging the developing solution.

2. The apparatus as set forth in claim 1, wherein said solution discharge port is composed of a plurality of discharge apertures provided side by side over the region corresponding to the dimension of the substrate.

3. The apparatus as set forth in claim 1, wherein said solution discharge port is composed of a discharge slit over the region corresponding to the dimension of the substrate.

4. The apparatus as set forth in claim 1, wherein said discharge resistance imparting means is a plate member provided close to an under face of said linear nozzle and having a drain passage capable of draining the solution.

5. The apparatus as set forth in claim 1, wherein said discharge resistance imparting means includes gas-flow blasting means, provided to face an under face of said linear nozzle, for blasting gas-flow to the discharged solution.

6. A solution processing apparatus according to claim 1, wherein said linear nozzle includes a plurality of solution inlet ports communicating with the solution supply mechanism, and a buffer chamber communicating with the solution inlet ports and the solution discharge port.

7. A solution processing apparatus for supplying a developing solution to a substrate to thereby perform predetermined processing, comprising:

a substrate holding mechanism configured to horizontally hold the substrate;

a solution supply mechanism configured to supply the developing solution;

a linear nozzle including a solution inlet port which communicates with the solution supply mechanism, and a solution discharge port having a dimension corresponding to that of the substrate, said linear nozzle further including a buffer chamber communicating with the solution inlet port and the solution discharge port, and guide grooves formed in an inner wall of the buffer chamber, the guide grooves guiding the developing solution to the solution discharge port;

a nozzle moving mechanism configured to scan-move the linear nozzle between a home position and a use position such that the linear nozzle moves along the substrate held on the substrate holding mechanism, said home position being away from the substrate holding mechanism, and said use position being right above the substrate holding mechanism;

discharge resistance providing means, located in the buffer chamber, for providing resistance for a developing solution discharged from the linear nozzle, thereby causing the developing solution to be discharged with a reduced pressure; and a control portion which controls the solution supply mechanism and the nozzle moving mechanism such that the developing solution is discharged from the linear nozzle before the linear nozzle reaches the use position in a scan-move mode in which the linear nozzle is scan-moved from the home position toward the use position.

8. The apparatus of claim 7, wherein a guide groove for guiding the solution to said discharge ports is provided on the surface of said resistance bar.

9. The apparatus as set forth in claim 8, wherein said guide groove is provided in spiral form.

* * * * *